(12) United States Patent
Lee et al.

(10) Patent No.: US 12,426,264 B2
(45) Date of Patent: Sep. 23, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Jinwoo Lee, Suwon-si (KR); Jooheon Kang, Seoul (KR); Donggeon Gu, Hwaseong-si (KR); Doyoon Kim, Hwaseong-si (KR); Yumin Kim, Seoul (KR); Suseong Noh, Suwon-si (KR); Changyup Park, Hwaseong-si (KR); Hyunjae Song, Hwaseong-si (KR); Dongho Ahn, Hwaseong-si (KR); Myunghun Woo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 429 days.

(21) Appl. No.: 17/989,061

(22) Filed: Nov. 17, 2022

(65) Prior Publication Data
US 2023/0165001 A1     May 25, 2023

(30) Foreign Application Priority Data
Nov. 23, 2021    (KR) .................. 10-2021-0162167

(51) Int. Cl.
*H10B 53/40*      (2023.01)
*H01L 23/528*     (2006.01)
(Continued)

(52) U.S. Cl.
CPC ......... *H10B 43/27* (2023.02); *H01L 23/5283* (2013.01); *H10B 41/10* (2023.02);
(Continued)

(58) Field of Classification Search
CPC ........ H10B 63/30; H10B 63/80; H10B 63/84; H10B 63/34; H10B 63/32; H10B 63/00; G11C 2213/71
See application file for complete search history.

(56) References Cited

U.S. PATENT DOCUMENTS 10,297,312 B1   5/2019   Futase
10,340,449 B2   7/2019   Wu et al.
(Continued)

FOREIGN PATENT DOCUMENTS

KR    10-2007-0092502 A    9/2007
KR    10-2019-0107499 A    9/2019
(Continued)

OTHER PUBLICATIONS

Office Action in Korean Appln. No. KR 10-2021-0162167, mailed on Jul. 31, 2025, 16 pages (with Machine Translation).

*Primary Examiner* — Christopher A Johnson
(74) *Attorney, Agent, or Firm* — Fish & Richardson P.C.

(57) ABSTRACT

A semiconductor device includes a lower structure, a stack structure including gate layers and interlayer insulating layers alternately stacked on the lower structure in a first direction, and a channel structure in a channel hole passing through the stack structure. The channel structure includes a variable resistance material layer in the channel hole, a data storage material layer between the variable resistance material layer and a sidewall of the channel hole, and a channel layer between the data storage material layer and the sidewall of the channel hole, the channel layer includes a first element, the variable resistance material layer includes a second element, different from the first element, oxygen, and oxygen vacancies, and the data storage material layer includes the first element, the second element, oxygen, and oxygen vacancies.

20 Claims, 16 Drawing Sheets

(51) Int. Cl.
  *H10B 41/10*  (2023.01)
  *H10B 41/27*  (2023.01)
  *H10B 41/35*  (2023.01)
  *H10B 43/10*  (2023.01)
  *H10B 43/27*  (2023.01)
  *H10B 43/35*  (2023.01)
(52) U.S. Cl.
  CPC ............. *H10B 41/27* (2023.02); *H10B 41/35* (2023.02); *H10B 43/10* (2023.02); *H10B 43/35* (2023.02)

(56) References Cited

U.S. PATENT DOCUMENTS

| | | |
|---|---|---|
| 11,011,700 B2 | 5/2021 | Matsuo et al. |
| 2007/0215977 A1 | 9/2007 | Lee et al. |
| 2014/0145137 A1 | 5/2014 | Ju et al. |
| 2015/0325788 A1 | 11/2015 | Hashim et al. |
| 2019/0280005 A1 | 9/2019 | Bin et al. |
| 2021/0074914 A1 | 3/2021 | Lee et al. |
| 2021/0384258 A1 | 12/2021 | Hwang |
| 2023/0013343 A1* | 1/2023 | Koo .................... H10D 30/694 |

FOREIGN PATENT DOCUMENTS

| | | |
|---|---|---|
| KR | 102179934 B1 | 11/2020 |
| KR | 10-2021-0029870 A | 3/2021 |
| KR | 10-2021-0032920 A | 3/2021 |

* cited by examiner

SEMICONDUCTOR DEVICES AND DATA STORAGE SYSTEMS INCLUDING THE SAME

CROSS-REFERENCE TO RELATED APPLICATIONS

This application claims the benefit under 35 USC 119(a) of Korean Patent Application No. 10-2021-0162167 filed on Nov. 23, 2021 in the Korean Intellectual Property Office, the entire disclosure of which is incorporated herein by reference for all purposes.

BACKGROUND

Inventive concepts relate to a semiconductor device and/or a data storage system including the same.

In data storage systems requiring or using data storage, a semiconductor device capable of storing high-capacity data is in demand. Accordingly, a method for increasing the data storage capacity of a semiconductor device is being studied. For example, as a method for increasing the data storage capacity of a semiconductor device, a semiconductor device including memory cells arranged three-dimensionally instead of two-dimensionally arranged memory cells has been proposed.

SUMMARY

Some example embodiments provide a semiconductor device and a data storage system having improved electrical characteristics.

According to some example embodiments, a semiconductor device includes a lower structure, a stack structure including gate layers and interlayer insulating layers alternately stacked on the lower structure in a first direction, and a channel structure in a channel hole passing through the stack structure. The channel structure includes a variable resistance material layer in the channel hole, a data storage material layer between the variable resistance material layer and a sidewall of the channel hole, and a channel layer between the data storage material layer and the sidewall of the channel hole. The channel layer includes a first element. The variable resistance material layer includes a second element, different from the first element and oxygen, and has oxygen vacancies, and the data storage material layer includes the first element, the second element and oxygen, and has oxygen vacancies.

According to some example embodiments, a semiconductor device includes a lower structure including a substrate, a stack structure including gate layers and interlayer insulating layers alternately stacked on the lower structure in a vertical direction, perpendicular to the substrate, and a channel structure in a channel hole passing through the stack structure. The channel structure includes a variable resistance material layer in the channel hole, a data storage material layer between the variable resistance material layer and a sidewall of the channel hole, and a channel layer between the data storage material layer and the sidewall of the channel hole. The channel structure includes first portions on the same height level as the gate layers and second portions on the same height level as the interlayer insulating layers. In a horizontal direction that is perpendicular to the vertical direction, a width of each of the first portions is wider than a width of each of the second portions. The variable resistance material layer includes a transition metal oxide having oxygen vacancies. The data storage material layer includes a transition metal-silicon oxide having oxygen vacancies. The channel layer includes a semiconductor material. A first concentration of oxygen vacancies in the data storage material layer is greater than a second concentration of oxygen vacancies in the variable resistance material layer.

According to some example embodiments, a data storage system includes a semiconductor storage device including a lower substrate, circuit elements on the lower substrate, a lower structure on the circuit elements and including an upper substrate, a stack structure including gate layers and interlayer insulating layers alternately stacked on the lower structure in a first direction, a channel structure in a channel hole passing through the stack structure, and an input/output pad electrically connected to the circuit elements. The data storage system further includes a controller electrically connected to the semiconductor storage device through the input/output pad and configured to control the semiconductor storage device. The channel structure includes a variable resistance material layer in the channel hole, a data storage material layer between the variable resistance material layer and a sidewall of the channel hole, and a channel layer between the data storage material layer and the sidewall of the channel hole, the channel layer includes a first element, the variable resistance material layer includes a second element, different from the first element, and oxygen. The channel layer has oxygen vacancies, and the data storage material layer includes the first element and the second element, oxygen and has oxygen vacancies.

BRIEF DESCRIPTION OF DRAWINGS

The above and other aspects, features, and advantages of inventive concepts will be more clearly understood from the following detailed description, taken in conjunction with the accompanying drawings, in which.

DETAILED DESCRIPTION

Hereinafter, some example embodiments will be described with reference to the accompanying drawings.

Figure 1:
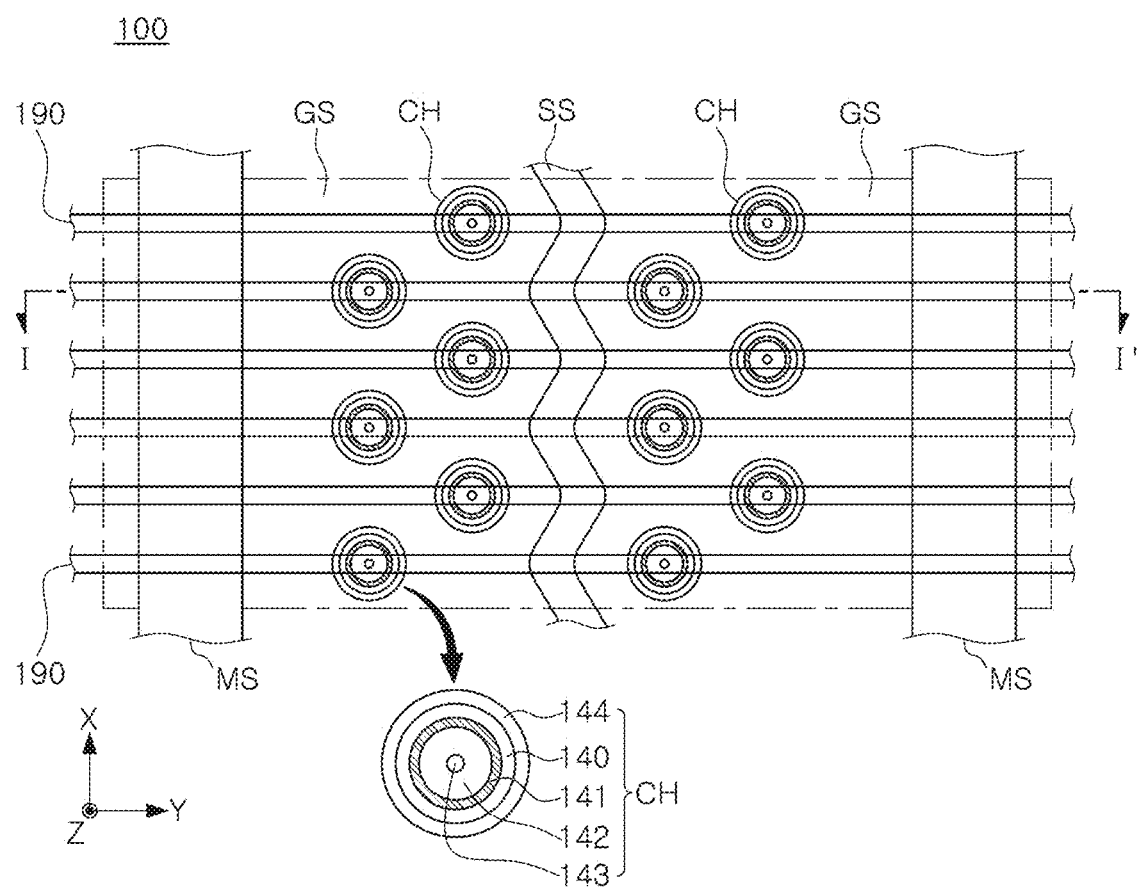
FIG. 1 is a plan view illustrating a semiconductor device according to some example embodiments.
Figure 2:
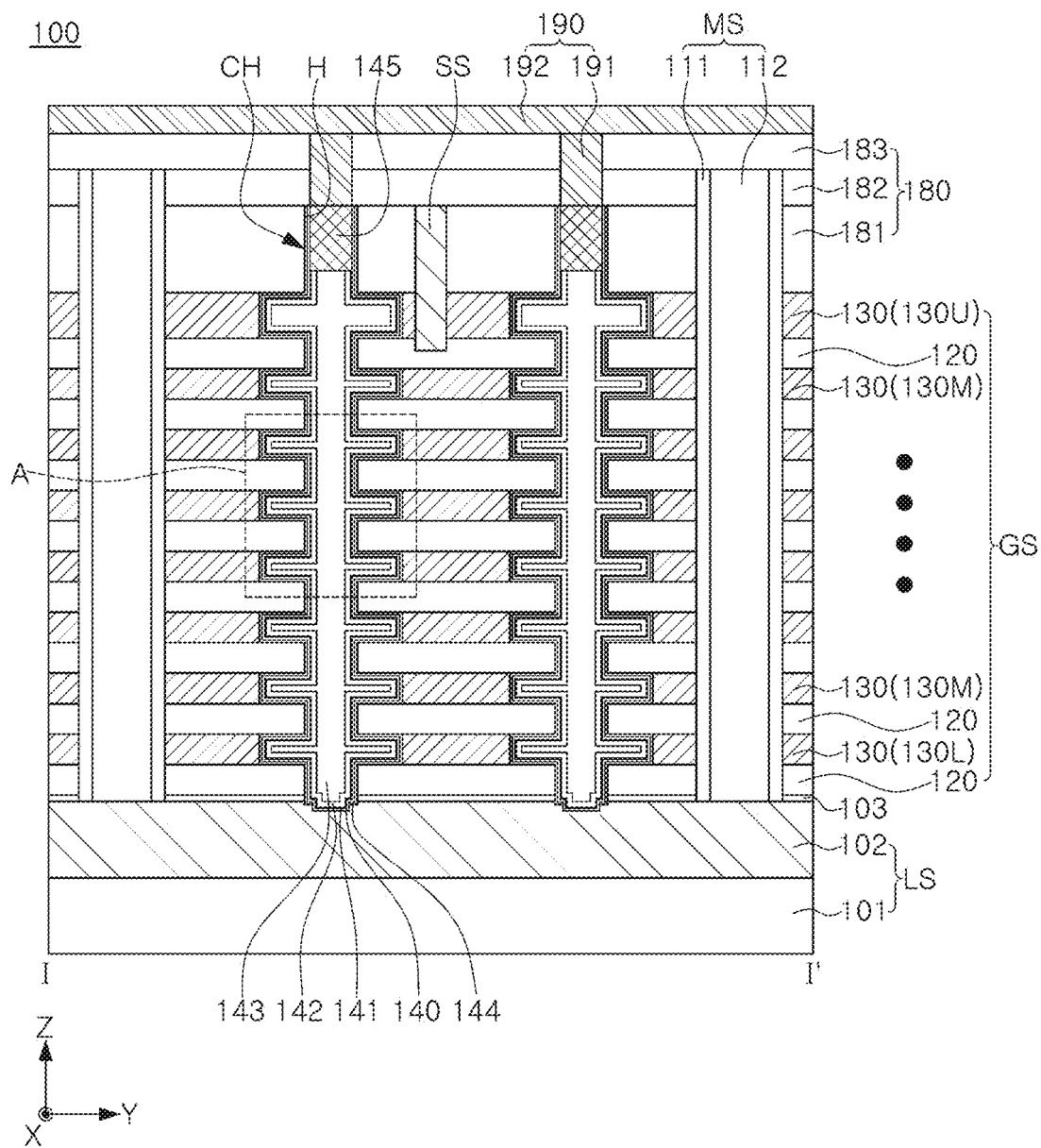
FIG. 2 is a cross-sectional view illustrating a semiconductor device according to some example embodiments.
Figure 3A:
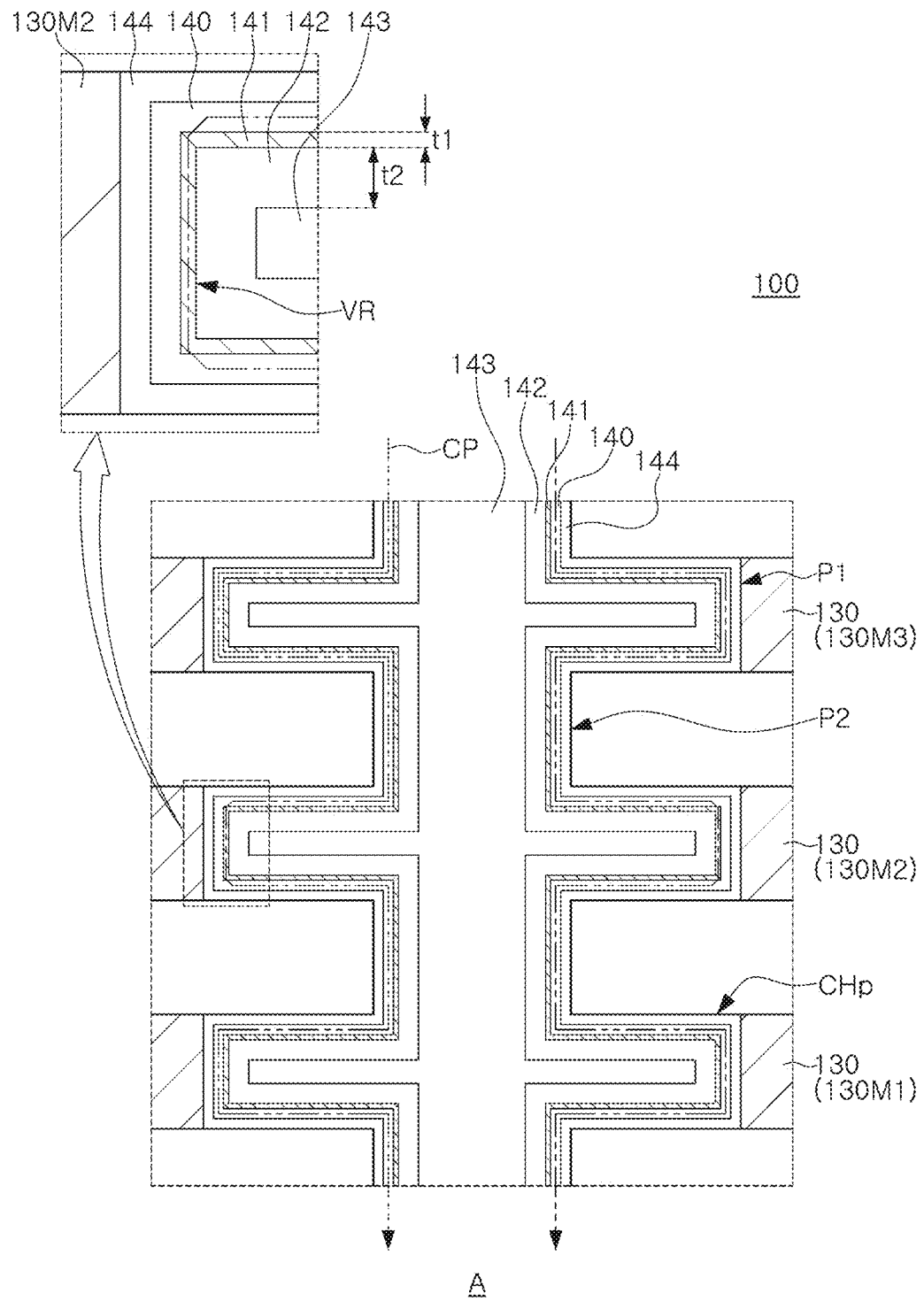
FIGS. 3A to 3C are partially enlarged cross-sectional views illustrating various examples of semiconductor devices according to some example embodiments.

FIG. 1 is a plan view illustrating a semiconductor device 100 according to some example embodiments, and FIG. 2 is a cross-sectional view illustrating the semiconductor device 100 according to some example embodiments. FIG. 2 illustrates a cross-section of the semiconductor device 100 of FIG. 1 taken along line I-I'. FIG. 3A is a partially enlarged view illustrating a region corresponding to region 'A' of the semiconductor device 100 of FIG. 2.

Referring to FIGS. 1 to 3A, the semiconductor device 100 may include a lower structure LS, a stack structure GS disposed on the lower structure LS and including gate layers 130 and interlayer insulating layers 120, separation structures MS extending by penetrating through the stack structure GS, channel structures CH passing through the stack structure GS and each including a channel layer 140, and an upper insulating layer 180.

The lower structure LS may include substrates 101 and 102. The substrates 101 and 102 may include a lower region 101 and an upper region 102 on the lower region 101.

The substrates 101 and 102 may have upper surfaces extending in horizontal directions such as an X-direction and a Y-direction. The substrates 101 and 102 may include a semiconductor material, for example, one or more of a group IV semiconductor, a group III-V compound semiconductor, or a group II-VI compound semiconductor. For example, the group IV semiconductor may include one or more of silicon, germanium, or silicon-germanium. The substrates 101 and 102 may be provided as a one or more of a bulk wafer, an epitaxial layer, an epitaxial layer, a silicon on insulator (SOI) layer, a semiconductor on insulator (SeOI) layer, or the like.

In some example embodiments, the upper region 102 may have N-type conductivity, e.g. may be doped with N-type material such as but not limited to one or more of arsenic or phosphorus. The upper region 102 may be electrically connected to the channel layer 140 while being in direct contact therewith. However, depending on some example embodiments, the upper region 102 may be omitted.

The stack structure GS may include the gate layers 130 and the interlayer insulating layers 120 alternately stacked on the lower structure LS.

The gate layers 130 may be disposed on the lower structure LS to be spaced apart from each other in a Z-direction perpendicular to the upper surface of the lower structure LS. The gate layers 130 may include a lower gate electrode 130L including the gate of the ground select transistor, intermediate gate electrodes 130M forming gates of the plurality of memory cells, and an upper gate electrode 130U including gates of the string select transistor. The lower gate electrode 130L may be or may correspond to a ground select line, the upper gate electrode 130U may be or may correspond to a string select line, and the intermediate gate electrodes 130M may be or may correspond to word lines. The number of intermediate gate electrodes 130M constituting/included in the plurality of memory cells may be determined, for example according to a capacity of the semiconductor device 100. According to some example embodiments, each of the upper and lower gate electrodes 130U and 130L may be one or two or more than two, and may have the same or different structure as the intermediate gate electrodes 130M. For example, although the upper gate electrode 130U is illustrated as having a thickness greater than that of the intermediate gate electrodes 130M and the lower gate electrode 130L, inventive concepts is not limited thereto. According to some example embodiments, the thickness and structure of the gate electrodes may be variously changed. In addition, some of the gate layers 130, for example, the intermediate gate electrodes adjacent to the upper or lower gate electrodes may be dummy gate electrodes, e.g. gate electrodes that are not electrically active during operation of the semiconductor device 100.

The gate layers 130 may include a gate electrode having a conductive material. The conductive material may include, for example, tungsten (W), but is not limited thereto, and may alternatively or additionally include polysilicon silicon such as doped polysilicon or a metal silicide material. In some example embodiments, each of the gate layers 130 may further include a gate dielectric layer covering the side surface of the gate electrode facing the channel structures CH while covering the upper and lower surfaces of the gate electrode. Accordingly, the gate dielectric layer may be disposed between the gate electrode and the channel structures CH and may extend between the gate electrode and the interlayer insulating layers 120. The gate dielectric layer may be formed of a dielectric material, and may include, for example, aluminum oxide (AlO).

The interlayer insulating layers 120 may be disposed between the gate layers 130. The interlayer insulating layers 120 may be alternately stacked with the gate layers 130 to form the stack structure GS. The interlayer insulating layers 120 may include an insulating material such as silicon oxide and/or silicon nitride.

The channel structures CH may include a first portion P1 at a height level of the gate layers 130 and a second portion P2 at a height level of the interlayer insulating layers 120, and the width of the first portion P1 and the width of the second portion P2 may be different. Accordingly, in a region adjacent to the channel structures CH, side surfaces of the gate layers 130 and side surfaces of the interlayer insulating layers 120 may not be aligned in the Z-direction. For example, the side surfaces of the gate layers 130 and the side surfaces of the interlayer insulating layers 120 may not be flush or coplanar.

In some example embodiments, the semiconductor device 100 may further include a buffer layer 103 disposed between the lower structure LS and the stack structure GS. The buffer layer 103 may include a material having etch selectivity with the interlayer insulating layers 120 under a specific wet and/or dry etch condition. For example, the buffer layer 103 may include an insulating material such as aluminum oxide (AlO). However, in some example embodiments, the buffer layer 103 may be omitted.

The separation structures MS may pass through the stack structure GS to be connected to the lower structure LS. The separation structures MS may be respectively located in trenches extending in the X-direction. The separation structures MS may be disposed to be spaced apart from each other in the Y-direction. For example, the separation structures MS may separate the gate layers 130 from each other in the Y-direction. In some example embodiments, the separation structures MS may include a first isolation pattern 111 including an insulating material and a second isolation pattern 112 including a conductive material. The first isolation pattern 111 may be interposed between the second isolation pattern 112 and the stack structure GS. However, in some example embodiments, the separation structures MS may not include a conductive material and may be formed of or include only an insulating material. The separation structures MS may have a shape in which a width decreases toward the substrate 101 due to a high aspect ratio, but the shape of the separation structures MS is not limited thereto.

Upper separation structures SS may extend in the X-direction between the separation structures MS adjacent in the Y-direction. The upper separation structures SS may be disposed to pass through the upper gate electrode 130U. As illustrated in FIG. 2, the upper separation structures SS may divide one gate layer in the Y-direction, and the number of gate layers separated by the upper separation structures SS may be variously changed in some example embodiments. For example, the number of separated gate layers 130 may be determined according to the number of string select lines. The upper separation structures SS may include an insulating material.

The channel structures CH may pass through the stack structure GS including the gate layers 130 and the interlayer insulating layers 120 to be electrically connected to the lower structure LS. In some example embodiments, the channel structures CH may extend into the lower structure LS, and alternatively, may contact the upper surface of the lower structure LS without extending into the lower structure LS. The channel structures CH respectively constitute or correspond to one memory cell string, and may be disposed to be spaced apart from each other while forming rows and columns on the substrate 101. The channel structures CH may be disposed to form a grid pattern in an X-Y plane or may be disposed in a zigzag shape in one direction. The channel structures CH may have a hole shape while having a column shape, and may have inclined sides that become narrower as the sides get closer to the substrate 101 according to an aspect ratio.

The channel structures CH may be disposed in a channel hole H passing through the stack structure GS and the buffer layer 103. The channel hole H may expose a portion of the lower structure LS, for example, the upper region 102. The channel hole H may include a vertical opening penetrating the stack structure GS in the Z-direction and horizontal openings extending from the vertical opening in a horizontal direction perpendicular to the Z-direction, for example, a Y-direction. The horizontal openings may be formed at a height level at which the gate layers 130 are disposed. The channel structures CH may be formed in the vertical opening and the horizontal openings and may include protrusions CHp disposed within the horizontal openings. Accordingly, the channel structures CH include the first portions P1 positioned on the same height level as the gate layers 130, and the second portions P2 positioned on the same height level as the interlayer insulating layers 120, and the width of the first portions P1 in the horizontal direction may be greater than the width of the second portions P2 in the horizontal direction.

Each of or at least some of the channel structures CH may further include one or more of a data storage material layer 141, a variable resistance material layer 142, a buried insulating layer 143, a dielectric layer 144, and a conductive pad 145, in addition to the channel layer 140.

The buried insulating layer 143 is or includes an insulating material disposed in the channel hole H, and the insulating material may include silicon oxide or the like. The buried insulating layer 143 may be spaced apart from the sidewall of the channel hole H, and the upper surface of the buried insulating layer 143 may be located at a higher level than an uppermost gate layer among the gate layers 130, and a lower surface of the buried insulating layer 143 may be located at a level lower than a lowermost gate layer among the gate layers 130. In some example embodiments, the upper portion of the buried insulating layer 143 may be formed of silicon oxide and the lower portion of the buried insulating layer 143 may be formed of silicon oxide including or defining voids or an air gap. However, in some example embodiments, the buried insulating layer 143 may be omitted.

The variable resistance material layer 142 is disposed in the channel hole H and may have a shape surrounding the buried insulating layer 143. However, in some example embodiments, the variable resistance material layer 142 may have a structure having protrusions from a column or a prism without the buried insulating layer 143. The variable resistance material layer 142 may include a transition metal oxide having oxygen vacancies. The transition metal oxide may include at least one of hafnium oxide (HfOx), aluminum oxide (AlOx), hafnium-aluminum oxide (HfAlOx), titanium oxide (TiOx), or lanthanum oxide (LaOx). As used herein a transition metal oxide "having oxygen vacancies" may indicate that a transition metal has a certain material structure wherein atoms do not have a full complement of oxygen, and instead has point defects corresponding to locations where oxygen would normally surround the transition metal. The transition metal oxide may have a crystalline lattices structure; however, example embodiments are not limited thereto.

The data storage material layer 141 may be disposed in the channel hole H, and may be disposed between a sidewall of the channel hole H and the variable resistance material layer 142. The data storage material layer 141 may have a shape surrounding at least a portion of the variable resistance material layer 142. The data storage material layer 141 may cover a portion except for the upper surface of the variable resistance material layer 142. In some example embodiments, the data storage material layer 141 may be a layer formed by reacting the variable resistance material layer 142 and the channel layer 140. Accordingly, the data storage material layer 141 may include a variable resistive material.

The channel layer 140 may be disposed in the channel hole H, and may be disposed between a sidewall of the channel hole H and the data storage material layer 141. The channel layer 140 may have a shape surrounding at least a portion of the data storage material layer 141. The channel layer 140 may be electrically connected to the upper region 102. The channel layer 140 may include a semiconductor material, and the semiconductor material may include at least one of polycrystalline silicon, single crystal silicon, or amorphous silicon. The semiconductor material may be an undoped material or a material containing p-type or n-type impurities.

The data storage material layer 141 may include a transition metal-silicon oxide. The data storage material layer 141 may include a material obtained by combining the semiconductor material of the channel layer 140 and the transition metal oxide of the variable resistance material layer 142 in a ratio of between 1 to about 1.6 and 1 to about 5.6. For example, the composition ratio of (the semiconductor material)/(the metal oxide) of the data storage material layer 141 may be in the range of about 0.18 to about 0.61.

The dielectric layer 144 may be disposed in the channel hole H, and may be disposed between a sidewall of the channel hole H and the channel layer 140. The dielectric layer 144 may have a shape surrounding at least a portion of the channel layer 140. The dielectric layer 144 may include silicon oxide ($SiO_2$), silicon nitride ($Si_3N_4$), silicon oxynitride (SiON), a high-k dielectric material, or a combination thereof.

The conductive pad 145 may be disposed to contact the channel layer 140 and be electrically connected to the channel layer 140. In some example embodiments, the channel layer 140 may extend along the side surface of the conductive pad 145, but the configuration is not limited thereto. For example, the channel layer 140 may be in contact with the lower surface of the conductive pad 145 and may not extend to the side surface of the conductive pad 145. The conductive pad 145 may cover the upper surface of the buried insulating layer 143. The conductive pad 145 may include, for example, doped polycrystalline silicon.

The dielectric layer 144, the channel layer 140, the data storage material layer 141, and the variable resistance material layer 142 may have a structure in which they are stacked sequentially on the sidewall of the channel hole H, and each of the dielectric layer 144, the channel layer 140, the data storage material layer 141, and the variable resistance material layer 142 may have a substantially uniform thickness. For example, the channel layer 140 and the data storage material layer 141 may be disposed to extend continuously along sidewalls of the vertical openings and the horizontal openings of the channel hole H. In some example embodiments, a first thickness t1 of the data storage material layer 141 may be less than a second thickness t2 of the variable resistance material layer 142. For example, the first thickness t1 ranges from about 1 nm to about 2 nm, and the second thickness t2 may range from about 7 nm to about 20 nm. As the first thickness t1 of the data storage material layer 141 decreases, a conductive filament providing an electrical path through the data storage material layer 141 may be more easily formed. Accordingly, the electrical characteristics of the data storage material layer 141 may be improved.

A first distance from the central axis of the channel structures CH in the Z-direction to the data storage material layer 141 of each of the first portions P1 may be greater than a second distance from the central axis to the data storage material layer 141 of each of the second portions P2. The first and second distances may be a shortest distance to the side surface of the data storage material layer 141 or may be a shortest distance to the center of the data storage material layer 141. The data storage material layer 141 continuously extends on the channel layer 140 in the channel hole H, and thus, may have a bent portion in the horizontal openings. The bent portion of the data storage material layer 141 may be formed in the first portion P1.

Areas of the data storage material layer 141 facing side surfaces of the gate layers 130 may regions capable of storing information and may constitute memory cells, and in some example embodiments, may be a data storage area VR that stores information in at least a portion of the first portions P1 of the data storage material layer 141, extending in the Z-direction, for example, a portion located at the first distance from the central axis.

The channel layer 140 may be or may include a semiconductor material including a first element, and the first element may include, for example, silicon (Si). In some example embodiments, the semiconductor material may be polysilicon. The variable resistance material layer 142 may include a second element different from the first element, and oxygen (O), and the second element may be a metal element such as, for example, hafnium (Hf), aluminum (Al), lanthanum (La), or titanium (Ti). The data storage material layer 141 may be a layer formed by reacting the channel layer 140 and the variable resistance material layer 142, and thus may include all of the first element, the second element, and oxygen. For example, the data storage material layer 141 may include the first element, but the variable resistance material layer 142 may not include the first element.

Each of the data storage material layer 141 and the variable resistance material layer 142 may include or have oxygen vacancies. The oxygen vacancy concentration of the data storage material layer 141 may be higher than the oxygen vacancy concentration of the variable resistance material layer 142. This may be due to a difference that occurs when the variable resistance material layer 142 and the data storage material layer 141 react with each other, such that oxygen is discharged or diffused and oxygen vacancies are additionally created. Since the data storage material layer 141 contains a relatively large amount of oxygen vacancies, a conductive filament may be formed. Accordingly, a semiconductor device having improved electrical characteristics may be provided by significantly reducing damage to the gate layers 130 and the like due to the forming.

FIG. 3A is a diagram illustrating a portion of a memory cell in a semiconductor device 100a according to some example embodiments, and of a current flow CP during a programming operation.

Referring to FIG. 3A, regions of the data storage material layer 141 facing the gate layers 130 may be programmed. The programming operation may include selecting a gate layer facing the data storage area VR of the data storage material layer 141 that needs to or is requested to be programmed among the gate layers 130 and deselecting the remaining gate layers. In this case, a selection gate layer 130M2 may be turned off, and unselected gate layers 130M1 and 130M3 may be turned on. For example, the programming operation may include applying 0V or a negative voltage to the selection gate layer 130M2, applying a voltage higher than a threshold voltage, for example, applying approximately 6V to the unselected gate layers 130M1 and 130M3, applying a voltage of about 5 to 6 V to an upper wiring pattern 192 corresponding to a bit line, and grounding the upper region 102 of the substrate 101 and 102, which may be or correspond to a common source line. However, the above voltage condition is only an example and does not limit inventive concepts, and may be changed to various voltage conditions. The current during the programming operation may flow sequentially along the channel layer 140 facing the first unselected gate layer 130M3 positioned above the selection gate layer 130M2, the data storage material layer 141 facing the selection gate layer 130M2, and the second unselected gate layer 130M1 located below the selection gate layer 130M2. For example, the dotted line indicated by the reference numeral CP of FIG. 3A may indicate the current path or current flow during the programming operation. For example, the current flow during the programming operation flows along the channel layer 140 and shifts to the data storage area VR of the data storage material layer 141 facing the selection gate layer 130M2 and, may flow through the data storage area VR by shifting back to the channel layer 140. As a current flows along the data storage area VR, the resistance of the corresponding region changes, and the data storage area VR of the data storage material layer 141 facing the selection gate layer 130M2 may be in a set state. In some example embodiments, the resistance of the data storage area VR of the data storage material layer 141 facing the selection gate layer 130M2 may be lowered by the programming operation.

An erase operation on the data storage area VR of the data storage material layer 141 programmed as described above may be performed by turning off the selection gate layer 130M2, turning on the unselected gate layers 130M1 and 130M3, applying an erase voltage, for example, a voltage of approximately 5-6V, to the upper region 102 of the substrate 101 and 102 which may be a common source line, and grounding the upper wiring pattern 192 which may be a bit line, as in the above-described programming operation. By changing the magnetic field while allowing the current to flow in the opposite direction to the current flow during the above-described programming operation, the data storage area VR of the data storage material layer 141 facing the selection gate layer 130M2 may be changed to a reset state. The resistance of the data storage area VR of the data storage material layer 141 may be increased by the erase operation. Accordingly, the resistance of the data storage area VR of the data storage material layer 141 in the set state by the programming operation and the resistance thereof in the reset state by the erase operation may be different from each other. For example, in the data storage area VR of the data storage material layer 141, the resistance in the set state may be lower than the resistance in the reset state.

In some example embodiments, the data storage material layer 141 has a relatively thin thickness and a relatively high concentration of oxygen vacancies, and thus, may include a conductive filament that provides an electrical path without separate formation of a conductive filament. For example, since there is no need to or expectation to apply a forming voltage higher than the set voltage for a programming operation, a semiconductor device having improved electrical characteristics may be provided without damaging the gate layers 130 or with a reduced amount of damage to the gate layers 130.

The upper insulating layer 180 may be disposed to cover the stack structure GS including the gate layers 130 and the interlayer insulating layers 120, and the channel structures (CH). The upper insulating layer 180 may be formed of an insulating material, and may include, for example, at least one of silicon oxide, silicon nitride, and silicon oxynitride. In some example embodiments, the upper insulating layer 180 may include a first upper insulating layer 181, a second upper insulating layer 182 on the first upper insulating layer 181, and a third upper insulating layer 183 on the second upper insulating layer 182. The first upper insulating layer 181 may fully or at least partially cover the stack structure GS, the second upper insulating layer 182 may cover the channel structures CH and the first upper insulating layer 181, and the third upper insulating layer 183 may fully or at least partially cover the separation structures MS and the second upper insulating layer 182. The channel structures CH may penetrate through the first upper insulating layer 181 and have an upper surface coplanar with the upper surface of the first upper insulating layer 181, and the separation structures MS may penetrate through the second upper insulating layer 182 and may have an upper surface coplanar with the upper surface of the second upper insulating layer 182.

In some example embodiments, the semiconductor device 100 may further include an upper wiring structure 190 including upper contact structures 191 and an upper wiring pattern 192. The upper contact structures 191 may pass through the second and third upper insulating layers 182 and 183 to be connected to the channel structures CH. The upper contact structures 191 may include a conductive material, for example, tungsten (W), copper (Cu), aluminum (Al), or the like. The upper wiring pattern 192 may be disposed on the third upper insulating layer 183 and may form the upper wiring structure electrically connected to the channel structures CH. The upper wiring pattern 192 may be or correspond to bit lines. The upper wiring pattern 192 may include a conductive material, for example, one or more of tungsten (W), copper (Cu), aluminum (Al), or the like. In some example embodiments, the upper contact structures 191 and the upper wiring pattern 192 may include the same material, but inventive concepts are not limited thereto. In some example embodiments, the upper wiring pattern 192 and the upper contact structures 191 may be formed by different processes, but may be integrally formed according to some example embodiments.

Figure 3B:
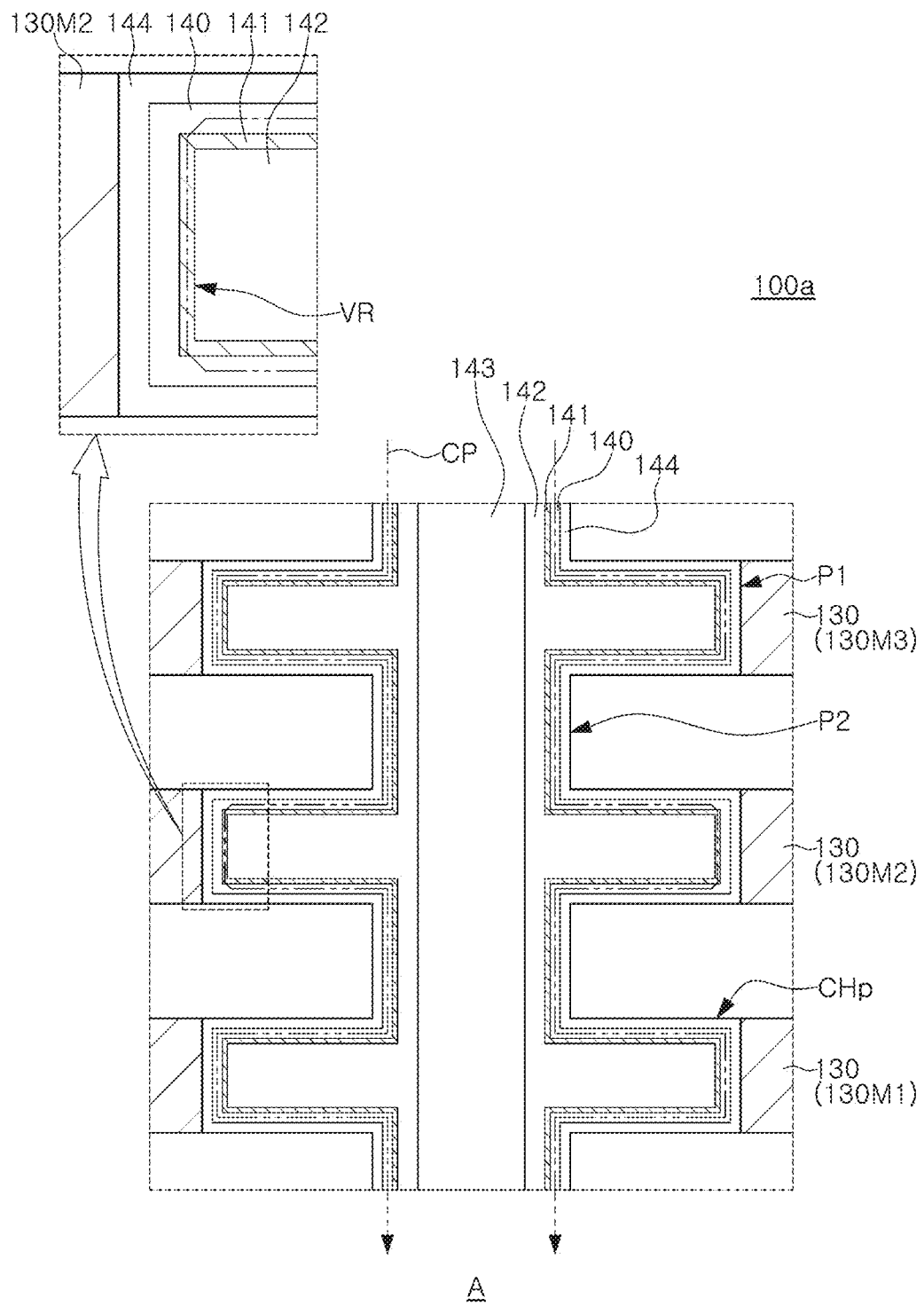

FIG. 3B is a partially enlarged cross-sectional view illustrating a modified example of the semiconductor device 100a according to some example embodiments. FIG. 3B is a partially enlarged view illustrating a region corresponding to area 'A' of FIG. 2.

Referring to FIG. 3B, the semiconductor device 100a according to some example embodiments may include channel structures having a structure different from that of the semiconductor device 100 of FIG. 3A.

As illustrated in FIGS. 2 and 3A, the channel structures CH may be disposed in the channel hole (H) including vertical openings extending in the Z-direction and horizontal openings extending in a horizontal direction perpendicular to the Z-direction, for example in the Y-direction.

The channel layer 140, the dielectric layer 144, and the conductive pad 145 of the channel structures CH may have the same structures as those described with reference to FIGS. 2 and 3A.

The buried insulating layer 143 may be an insulating material disposed in the channel hole H. The buried insulating layer 143 may have a pillar shape that does not include a portion protruding in a horizontal direction perpendicular to the Z-direction.

The variable resistance material layer 142 may include protrusions extending into the horizontal openings while covering the outer surface of the buried insulating layer 143. For example, the variable resistance material layer 142 may include protrusions protruding from the first portions P1 toward the gate layers 130. This may be or correspond to a structure that occurs when the thickness of the variable resistance material layer 142 is relatively thick compared to FIG. 3A or that the gate layers 130 are formed relatively thin.

The data storage material layer 141 may extend between the channel layer 140 and the variable resistance material layer 142. At least a portion of the data storage material layer 141 may cover the protrusions of the variable resistance material layer 142. In some example embodiments, the data storage material layer 141 may have substantially the same thickness as that of the data storage material layer of FIG. 3A, but may have a relatively thick thickness according to some example embodiments.

Figure 3C:
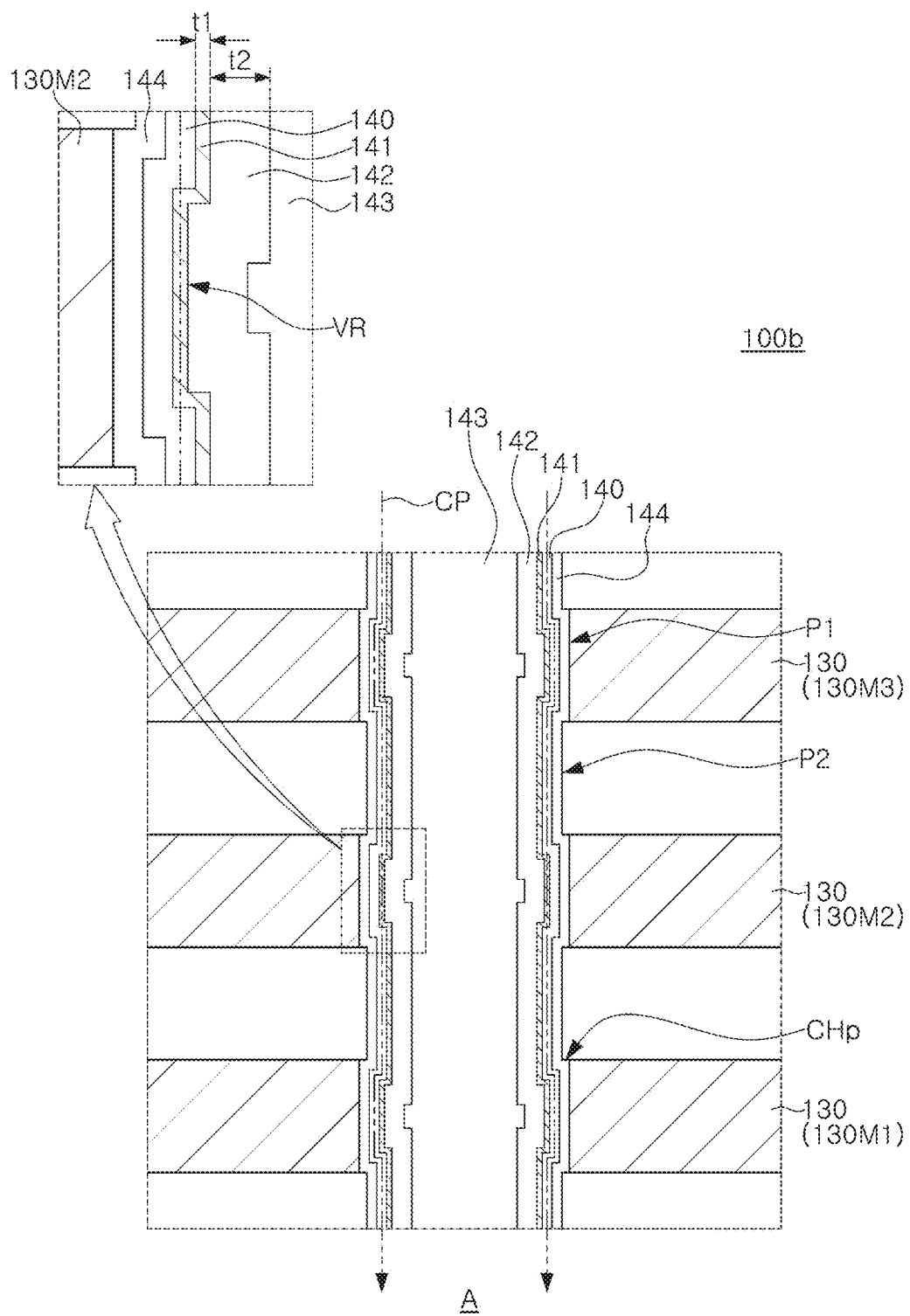

FIG. 3C is a partially enlarged cross-sectional view illustrating a modified example (100b) of the semiconductor device according to some example embodiments. FIG. 3C is a partially enlarged view illustrating an area corresponding to area 'A' in FIG. 2.

Referring to FIG. 3C, a semiconductor device 100b according to some example embodiments may include a channel structure and gate layers different from those of the semiconductor device of FIG. 3A.

As illustrated in FIGS. 2 and 3A, the channel structures CH may be disposed in a channel hole H including a vertical opening extending in the Z-direction and horizontal openings extending in a horizontal direction perpendicular to the Z-direction, for example, a Y-direction. However, the horizontal openings may extend by a depth smaller than the horizontal openings described with reference to FIG. 3A. Accordingly, the data storage material layer 141 may not be disposed in the horizontal openings. For example, the data storage material layer 141 may not overlap the interlayer insulating layers 120 in the Z-direction.

The channel structures CH may include a first portion P1 at a height level of the gate layers 130 and a second portion P2 at a height level of the interlayer insulating layers 120. The data storage material layer 141 of the first portion P1 may overlap the channel layer 140 of the second portion P2 in the Z-direction. Accordingly, during the programming operation, the current flow CP may change the resistance of the data storage area VR of the data storage material layer 141 facing the selection gate layer 130M2 while flowing in a straight direction (e.g. vertically).

Figure 4:
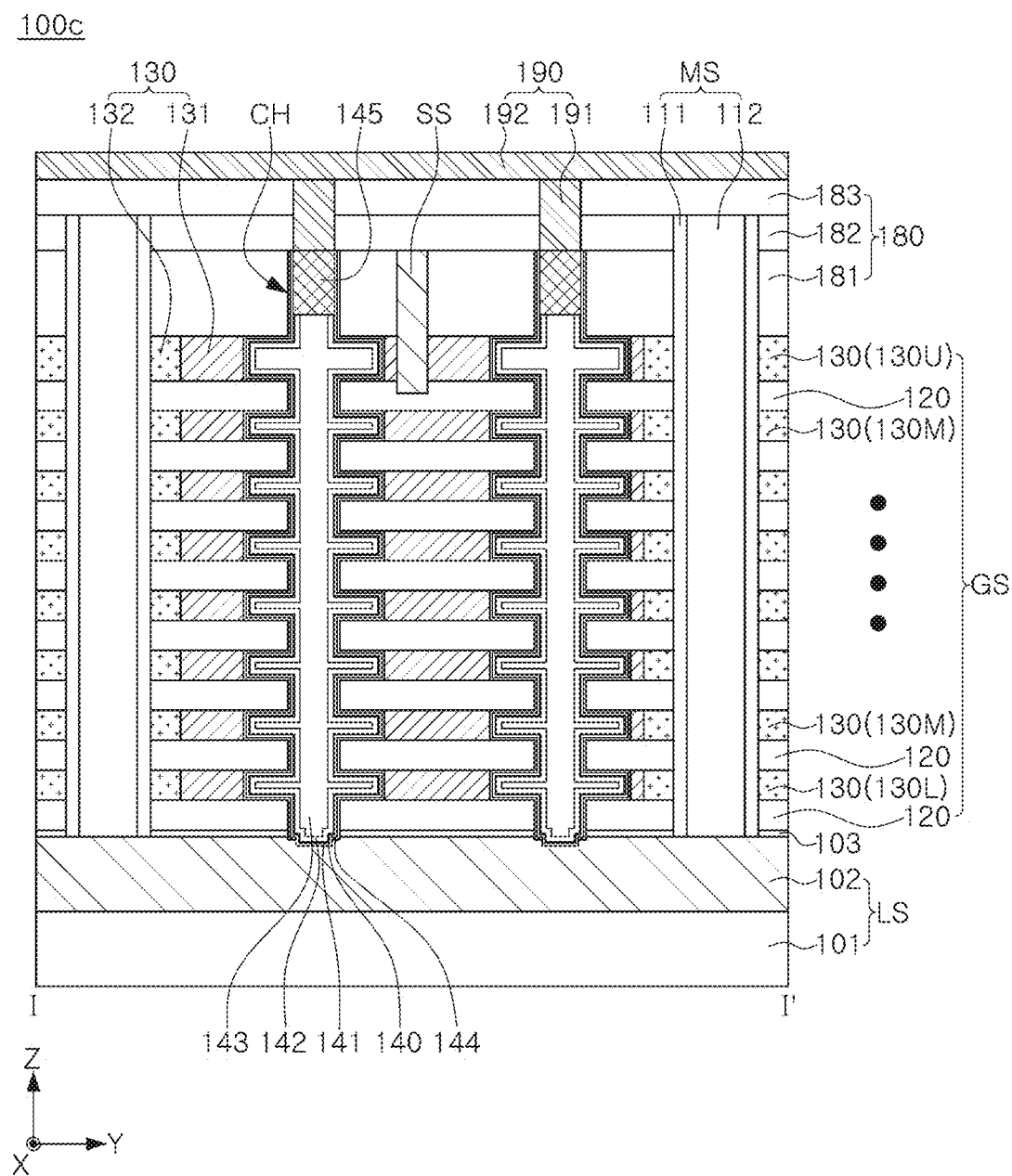
FIG. 4 is a cross-sectional view illustrating a semiconductor device according to some example embodiments.

FIG. 4 is a cross-sectional view illustrating a semiconductor device 100c according to some example embodiments. FIG. 4 illustrates a region corresponding to a cross section of the semiconductor device 100c taken along line I-I' of FIG. 1.

Referring to FIG. 4, the semiconductor device 100c may have a structure of gate layers different from that of the semiconductor device 100 of FIGS. 1 to 3A. Accordingly, a redundant description of a structure similar to that described in FIGS. 1 to 3A will be omitted.

Each of the gate layers 130 may include a first gate portion 131 adjacent to the channel structures CH and a second gate portion 132 adjacent to the separation structures MS. The first gate portion 131 may surround side surfaces of the channel structures CH.

The first gate portion 131 may be formed of doped polysilicon, and the second gate portion 132 may be formed of a metal silicide (e.g., one or more of WSi, TiSi, or the like), a metal nitride (e.g., one or more of WN, TiN, or the like), and/or a metal (e.g., W, or the like).

Each of the gate layers 130 may include the first and second gate portions 131 and 132, thereby improving electrical characteristics of the gate layers 130. Accordingly, in some example embodiments, a semiconductor device having improved electrical characteristics may be provided.

Figure 5:
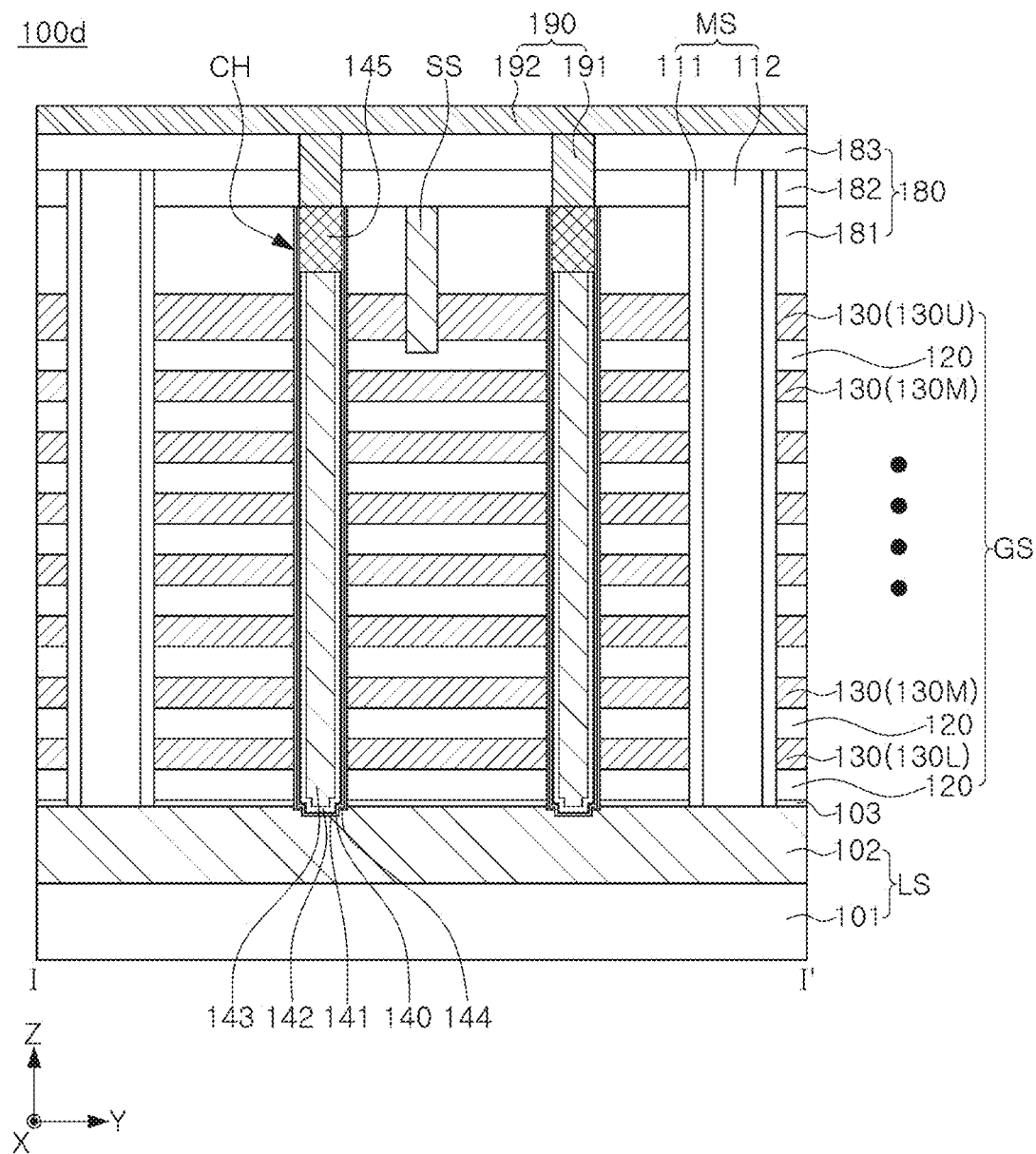
FIG. 5 is a cross-sectional view illustrating a semiconductor device according to some example embodiments.

FIG. 5 is a cross-sectional view illustrating a semiconductor device 100d according to some example embodiments. FIG. 5 illustrates a region corresponding to a cross section of the semiconductor device 100d taken along line I-I' of FIG. 1.

Referring to FIG. 5, the channel structures CH may have a pillar shape extending in the Z-direction while penetrating the gate layers 130 and the interlayer insulating layers 120. For example, the channel structures CH may not include the protrusions CHp extending in a horizontal direction perpendicular to the Z-direction, unlike those described with reference to FIGS. 2 and 3A. Accordingly, the channel layer 140 and the data storage material layer 141 of the channel structures CH may have an annular shape. The data storage material layer 141 may extend in the Z-direction and may not include a bent portion.

Figure 6:
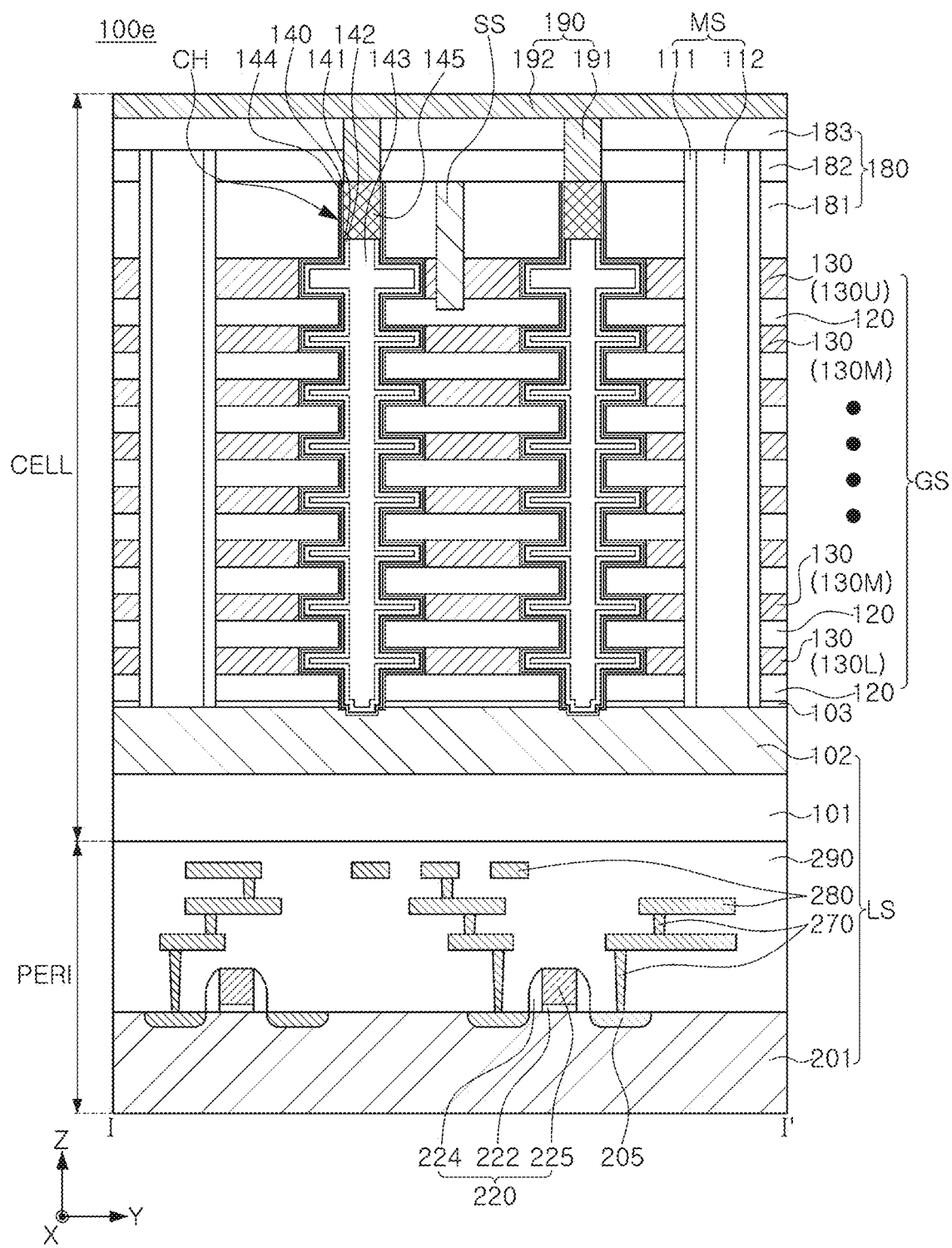
FIG. 6 is a cross-sectional view illustrating a semiconductor device according to some example embodiments.

FIG. 6 is a cross-sectional view illustrating a semiconductor device 100e according to some example embodiments. FIG. 6 illustrates a region corresponding to a cross section of the semiconductor device 100e taken along line I-I' of FIG. 1.

Referring to FIG. 6, the semiconductor device 100e may include a memory cell area CELL and a peripheral circuit area PERI, stacked vertically. The memory cell area CELL may be disposed on the upper end of the peripheral circuit area PERI. For example, in the case of the semiconductor device 100 of FIG. 2, the peripheral circuit area PERI may be disposed on the substrate 101 in an area not illustrated, or as in the semiconductor device 100e of various example embodiments, the peripheral circuit area PERI may be disposed below the substrate 101 and 102. In some example embodiments, the cell area CELL may be disposed below the peripheral circuit area PERI. For the description of the memory cell area CELL, the description with reference to FIGS. 1 to 5 may be equally applied.

The peripheral circuit area PERI may include a base substrate 201, circuit elements 220 disposed on the base substrate 201, circuit contact plugs 270, and circuit wiring lines 280.

The base substrate 201 may have an upper surface extending in the X-direction and the Y-direction. In the base substrate 201, separate device isolation layers may be formed to define an active region. Source/drain regions 205 including impurities may be disposed in a portion of the active region. The base substrate 201 may include a semiconductor material, for example, one or more of a group IV semiconductor, a group III-V compound semiconductor, or a group II-VI compound semiconductor. The base substrate 201 may be provided as a bulk wafer or an epitaxial layer. In various example embodiments, the base substrate 201 may be provided as a semiconductor layer such as a polycrystalline silicon layer or an epitaxial layer.

The circuit elements 220 may include transistors such as horizontal transistors. Each of or at least some of the circuit elements 220 may include a circuit gate dielectric layer 222, a spacer layer 224, and a circuit gate electrode 225; however, example embodiments are not limited thereto. Source/drain regions 205 may be disposed in the base substrate 201 on both sides of the circuit gate electrode 225. The circuit elements 220 may be electrically connected to the gate layers 130 and/or the channel structures CH.

A peripheral region insulating layer 290 may be disposed on the circuit elements 220, on the base substrate 201. The circuit contact plugs 270 may pass through the peripheral region insulating layer 290 to be connected to the source/drain regions 205. Electrical signals may be applied to the circuit elements 220 by the circuit contact plugs 270. In an area not illustrated, the circuit contact plugs 270 may also be connected to the circuit gate electrode 225. The circuit wiring lines 280 may be connected to the circuit contact plugs 270 and may be disposed as a plurality of layers.

In the semiconductor device 100e, after the peripheral circuit area PERI is first manufactured or fabricated, the substrate 101 and 102 of the memory cell area CELL may be formed thereon to manufacture the memory cell area CELL. The substrate 101 and 102 may have the same size as the base substrate 201 or may be formed smaller than the base substrate 201. In various example embodiments, the lower structure LS may refer to including the peripheral circuit area PERI and the substrate 101 and 102. The memory cell area CELL and the peripheral circuit area PERI may be connected to each other in an area not illustrated. For example, one end of the gate layers 130 in the Y-direction may be electrically connected to the circuit elements 220. The form in which the memory cell area CELL and the peripheral circuit area PERI are vertically stacked may also be applied to the some example embodiments of FIGS. 1 to 5.

Figure 7:
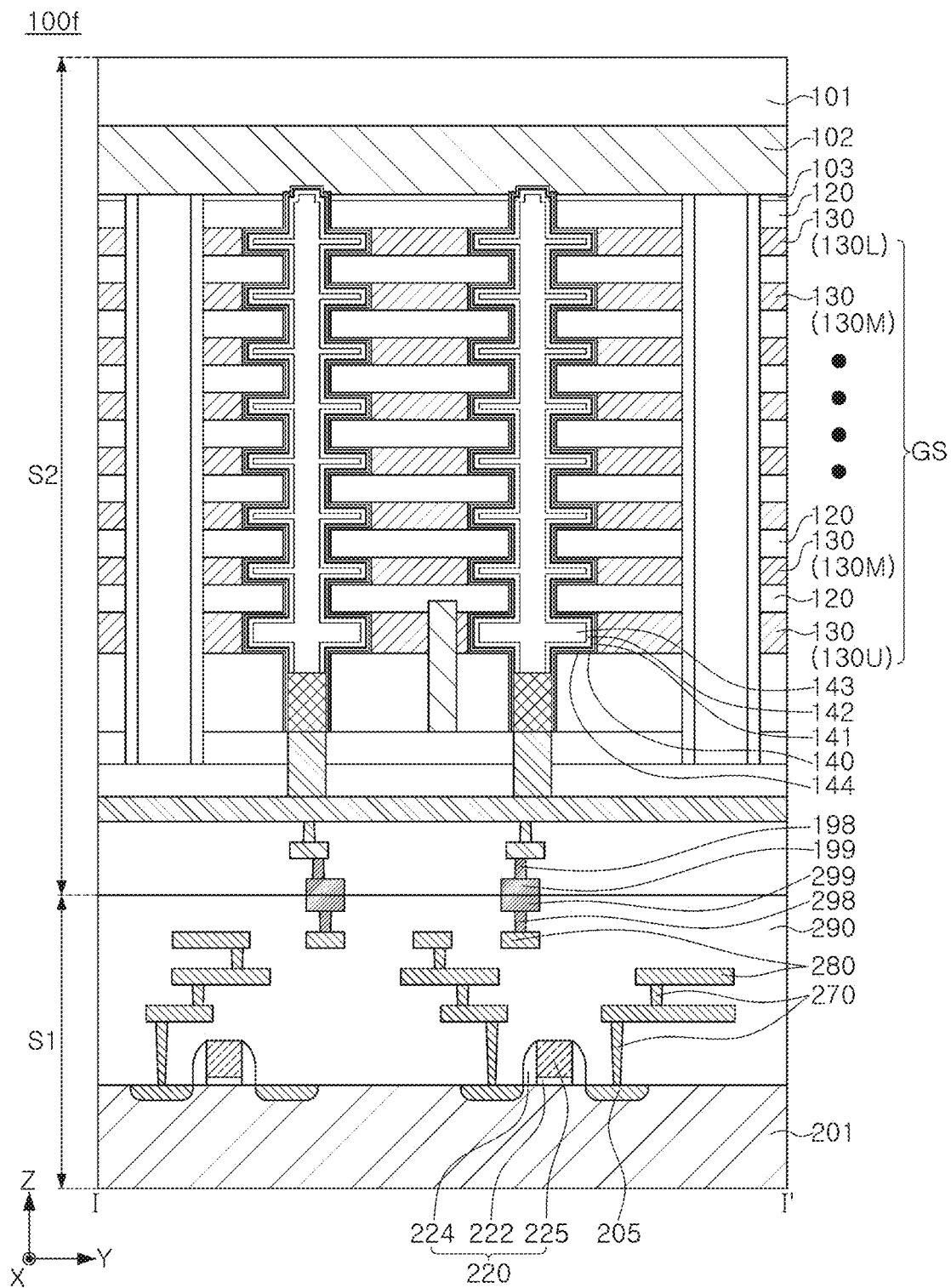
FIG. 7 is a cross-sectional view illustrating a semiconductor device according to some example embodiments.

FIG. 7 is a cross-sectional view illustrating a semiconductor device 100f according to some example embodiments. FIG. 7 illustrates a region corresponding to a cross section of the semiconductor device 100f taken along line I-I' of FIG. 1.

Referring to FIG. 7, the semiconductor device 100f may include a first structure S1 and a second structure S2 bonded by a wafer bonding method.

The description of the peripheral circuit area PERI described above with reference to FIG. 6 may be applied to the first structure S1. However, the first structure S1 may further include first bonding vias 298 and first bonding pads 299, which are bonding structures.

The first bonding vias 298 may be disposed on uppermost circuit wiring lines 280 to be connected to the circuit wiring lines 280. At least a portion of the first bonding pads 299 may be connected to the first bonding vias 298, on the first bonding vias 298. The first bonding pads 299 may be connected to the second bonding pads 199 of the second structure S2. The first bonding pads 299 together with the second bonding pads 199 may provide an electrical connection path according to the bonding between the first structure S1 and the second structure S2. The first bonding vias 298 and the first bonding pads 299 may include a conductive material, for example, copper (Cu).

For the second structure S2, the descriptions with reference to FIGS. 1 to 6 may be equally applied, unless otherwise specified. The second structure S2 may further include second bonding pads 199 and second bonding vias 198, which are bonding structure. The second structure S2 may further include a protective layer covering the upper surface of the substrate 101 and 102.

The second bonding vias 198 and the second bonding pads 199 may be disposed below lowermost wiring lines. The second bonding vias 198 may be connected to the wiring lines and the second bonding pads 199, and the second bonding pads 199 may be bonded to the first bonding pads 299 of the first structure S1. The second bonding vias 198 and the second bonding pads 199 may include a conductive material, for example, copper (Cu).

The first structure S1 and the second structure S2 may be bonded by copper (Cu)-copper (Cu) bonding by the first bonding pads 299 and the second bonding pads 199. In addition to or alternatively to the copper (Cu)-copper (Cu) bonding, the first structure S1 and the second structure S2 may be additionally bonded by dielectric-dielectric bonding. The dielectric-dielectric bonding may be junction by dielectric layers forming a portion of each of the peripheral region insulating layer 290 and the upper insulating layer 180, and surrounding each of the first bonding pads 299 and the second bonding pads 199. Accordingly, the first structure S1 and the second structure S2 may be bonded without a separate adhesive layer.

Figure 8:
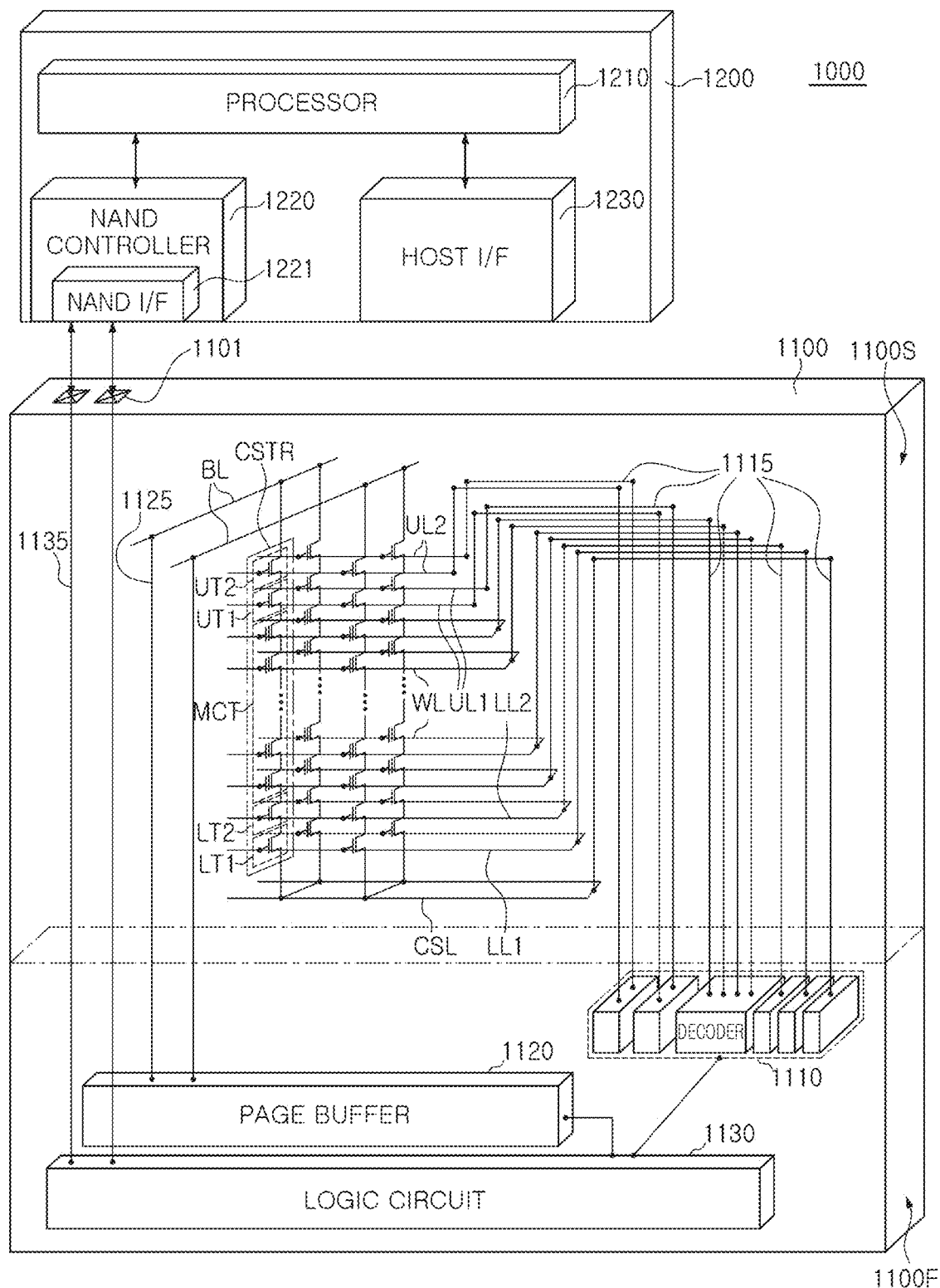
FIG. 8 is a diagram schematically illustrating a data storage system including a semiconductor device according to some example embodiments.

FIG. 8 is a diagram schematically illustrating a data storage system 1000 including a semiconductor device according to some example embodiments.

Referring to FIG. 8, the data storage system 1000 may include a semiconductor device 1100 and a controller 1200 electrically connected to the semiconductor device 1100. The data storage system 1000 may be or may include a storage device including one or a plurality of semiconductor devices 1100 or an electronic device including a storage device. For example, the data storage system 1000 may be or may include a solid state drive device (SSD) including one or a plurality of semiconductor devices 1100, a universal serial bus (USB), a computing system, a medical device, or a communication device.

The semiconductor device 1100 may be or may include a nonvolatile memory device, for example, the NAND flash memory device described above with reference to FIGS. 1 to 7. The semiconductor device 1100 may include a first semiconductor structure 1100F and a second semiconductor structure 1100S on the first semiconductor structure 1100F. In some example embodiments, the first semiconductor structure 1100F may be disposed next to the second semiconductor structure 1100S. The first semiconductor structure 1100F may be or may include a peripheral circuit structure including a decoder circuit 1110, a page buffer 1120, and a logic circuit 1130. The second semiconductor structure 1100S may be or may include a memory cell structure including bit line BL, a common source line CSL, word lines WL, first and second upper gate lines UL1 and UL2, first and second lower gate lines LL1 and LL2, and memory cell strings CSTR between the bit line BL and the common source line CSL.

In the second semiconductor structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may be variously modified according to some example embodiments, and may be the same or different form one another.

In some example embodiments, the upper transistors UT1 and UT2 may include a string select transistor, and the lower transistors LT1 and LT2 may include a ground select transistor. The lower gate lines LL1 and LL2 may or correspond to be gate electrodes of the lower transistors LT1 and LT2, respectively. The word lines WL may be or correspond to gate electrode layers of the memory cell transistors MCT, and the upper gate lines UL1 and UL2 may be gate electrodes of the upper transistors UT1 and UT2, respectively.

In some example embodiments, the lower transistors LT1 and LT2 may include a ground select transistor. The upper transistors UT1 and UT2 may include a string select transistor connected in series.

The common source line CSL, the first and second lower gate lines LL1 and LL2, the word lines WL, and the first and second upper gate lines UL1 and UL2 may be electrically connected to the decoder circuit 1110 through first connection lines 1115 extending from the first semiconductor structure 1100F to the second semiconductor structure 1100S. The bit lines BL may be electrically connected to the page buffer 1120 through second connection lines 1125 extending from the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 extending from the first semiconductor structure 1100F to the second semiconductor structure 1100S.

The controller 1200 may include a processor 1210, a NAND controller 1220, and a host interface 1230. In some example embodiments, the data storage system 1000 may include a plurality of semiconductor devices 1100, and in this case, the controller 1200 may control the plurality of semiconductor devices 1100.

The processor 1210 may control the overall operation of the data storage system 1000 including the controller 1200. The processor 1210 may operate according to a firmware such as a predetermined or dynamically determined firmware, and may access the semiconductor device 1100 by controlling the NAND controller 1220. The NAND controller 1220 may include a NAND interface 1221 that handles communication with the semiconductor device 1100. Through the NAND interface 1221, a control command for controlling the semiconductor device 1100, data to be written to the memory cell transistors MCT of the semiconductor device 1100, data to be read from the memory cell transistors MCT of the semiconductor device 1100 may be transmitted. The host interface 1230 may provide a communication function between the data storage system 1000 and an external host. When receiving a control command from an external host through the host interface 1230, the processor 1210 may control the semiconductor device 1100 in response to the control command.

Figure 9:
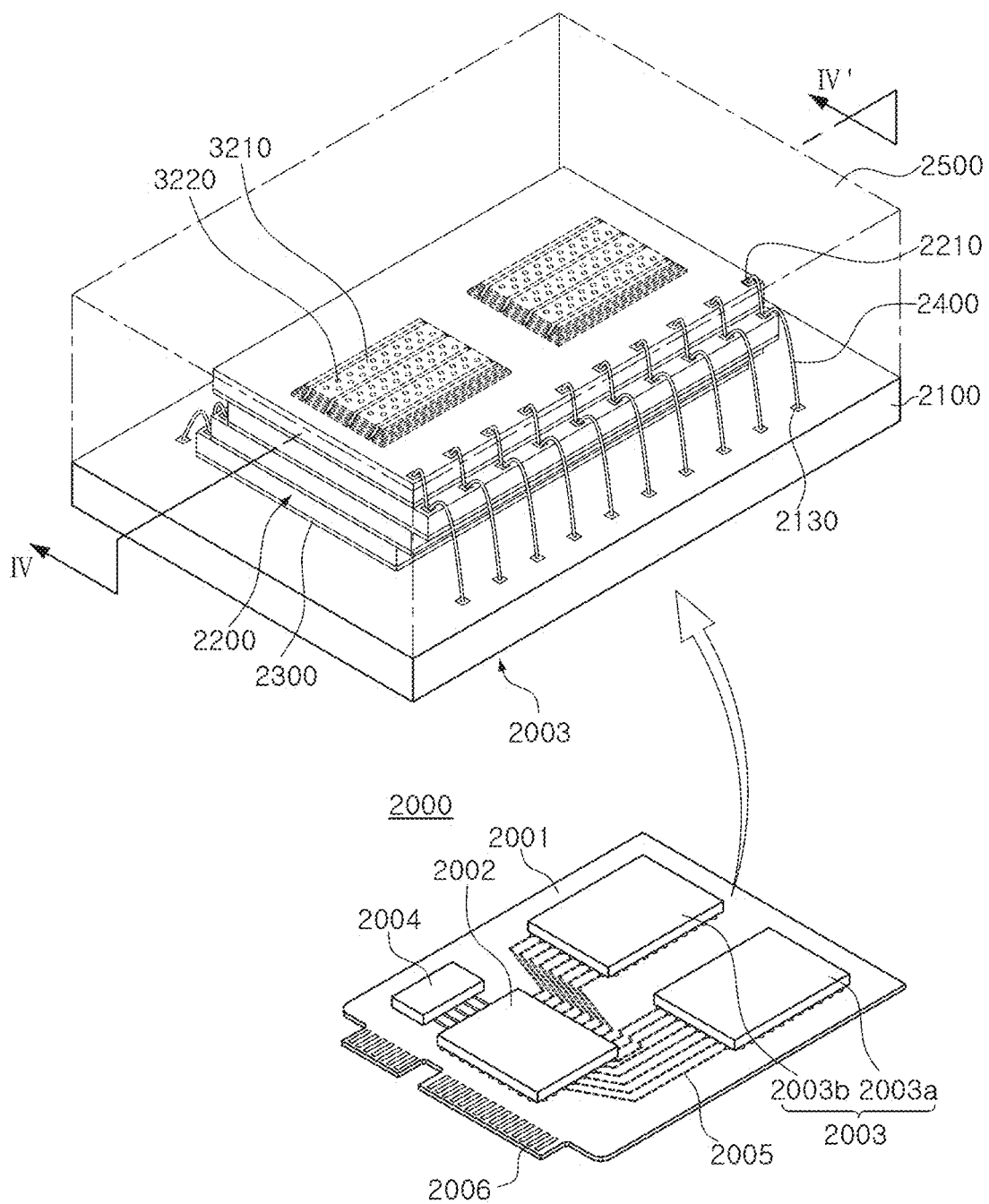
FIG. 9 is a schematic perspective view of a data storage system including a semiconductor device according to some example embodiments.

FIG. 9 is a perspective view schematically illustrating a data storage system including a semiconductor device according to some example embodiments.

Referring to FIG. 9, a data storage system 2000 according to some example embodiments includes a main board 2001, a controller 2002 mounted on the main board 2001, one or more semiconductor packages 2003, and a DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and/or the arrangement of the plurality of pins in the connector 2006 may vary according to a communication interface between the data storage system 2000 and the external host. In some example embodiments, the data storage system 2000 may communicate with an external host according to any one of interfaces such as Universal Serial Bus (USB), Peripheral Component Interconnect Express (PCI-Express), Serial Advanced Technology Attachment (SATA), and M-Phy for Universal Flash Storage (UFS). In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data to and/or read data from the semiconductor package 2003, and may improve the operation speed of the data storage system 2000.

The DRAM 2004 may be or may include a buffer memory for reducing a speed difference between the semiconductor package 2003 as a data storage space and an external host. The DRAM 2004 included in the data storage system 2000 may also operate as a kind of cache memory, and may provide a space for temporarily storing data in a control operation for the semiconductor package 2003. When the data storage system 2000 includes a DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of or either of the first and second semiconductor packages 2003a and 2003b may include a package substrate 2100, semiconductor chips 2200 on the package substrate 2100, adhesive layers 2300 disposed on a lower surface of each of the semiconductor chips 2200, a connection structure 2400 electrically connecting the semiconductor chips 2200 and the package substrate 2100, and a molded layer 2500 covering the semiconductor chips 2200 and the connection structure 2400 on the package substrate 2100.

The package substrate 2100 may be or may include a printed circuit board including upper package pads 2130. Each semiconductor chip 2200 may include an input/output pad 2210. The input/output pad 2210 may correspond to the input/output pad 1101 of FIG. 8. Each of the semiconductor chips 2200 may include gate mold structures 3210 and channel structures 3220. Each of the semiconductor chips 2200 may include the semiconductor device described above with reference to FIGS. 1 to 7.

In some example embodiments, the connection structure 2400 may be a bonding wire electrically connecting the input/output pad 2210 and the upper package pads 2130. Accordingly, in each of the first and second semiconductor packages 2003a and 2003b, the semiconductor chips 2200 may be electrically connected to each other by a bonding wire method, and may be electrically connected to the upper package pads 2130 of the package substrate 2100. According to some example embodiments, in each of the first and second semiconductor packages 2003a and 2003b, the semiconductor chips 2200 may be electrically connected to each other by a connection structure including a Through Silicon Via (TSV) instead of or in addition to the bonding wire-type connection structure 2400.

In some example embodiments, the controller 2002 and the semiconductor chips 2200 may be included in one package. In some example embodiments, the controller 2002 and the semiconductor chips 2200 may be mounted on a separate interposer substrate different from the main board 2001, and the controller 2002 and the semiconductor chips 2200 may be connected to each other by wiring formed on the interposer substrate.

Figure 10:
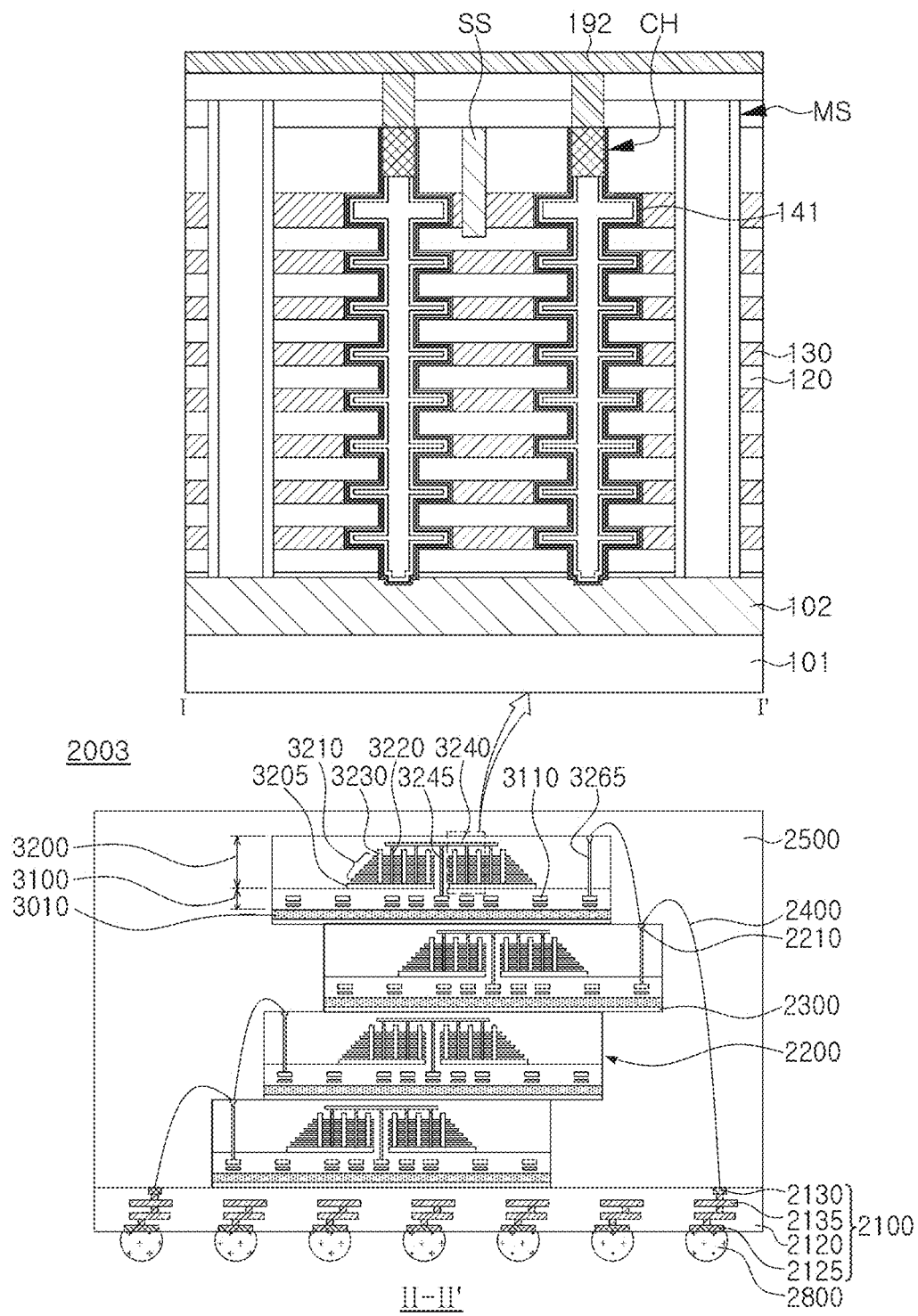
FIG. 10 is a cross-sectional view schematically illustrating a semiconductor package according to some example embodiments.

FIG. 10 is a cross-sectional view schematically illustrating a semiconductor package according to some example embodiments. FIG. 10 illustrates an illustrative embodiment of the semiconductor package 2003 of FIG. 9, and conceptually illustrates a region cut along the cutting line II-II' of the semiconductor package 2003 of FIG. 9.

Referring to FIG. 10, in the semiconductor package 2003, the package substrate 2100 may be a printed circuit board. The package substrate 2100 may include a package substrate body 2120, upper package pads 2130 (see FIG. 9) disposed on the upper surface of the package substrate body 2120, lower package pads 2125 disposed on or exposed through the lower surface of the package substrate body 2120, and internal wirings 2135 electrically connecting the upper package pads 2130 and the lower package pads 2125 inside the package substrate body 2120. The upper package pads 2130 may be electrically connected to the connection structures 2400. The lower package pads 2125 may be connected to the wiring patterns 2005 of the main board 2001 of the data storage system 2000 as illustrated in FIG. 9 through conductive connectors 2800.

Each of the semiconductor chips 2200 may include a semiconductor substrate 3010, and a first semiconductor structure 3100 and a second semiconductor structure 3200 that are sequentially stacked on the semiconductor substrate 3010. The first semiconductor structure 3100 may include a peripheral circuit area including peripheral wirings 3110. The second semiconductor structure 3200 may include a common source line 3205, a gate mold structure 3210 on common source line 3205, channel structures 3220 and isolation regions 3230 passing through the gate mold structure 3210, bit lines 3240 electrically connected to the memory channel structures 3220, and cell contact plugs 3235 electrically connected to the word lines WL (refer to FIG. 8) of the gate mold structure 3210. As described above with reference to FIGS. 1 to 7, each of the semiconductor chips 2200 may include channel structures CH including a variable resistance material layer 142 and a data storage material layer 141.

Each of the semiconductor chips 2200 may include a through-wiring 3245 electrically connected to the peripheral wirings 3110 of the first semiconductor structure 3100 and extending into the second semiconductor structure 3200. The through-wiring 3245 may be disposed outside the gate mold structure 3210, and may be further disposed to pass through the gate mold structure 3210. Each of the semiconductor chips 2200 may further include an input/output pad 2210 (refer to FIG. 9) electrically connected to the peripheral wirings 3110 of the first semiconductor structure 3100.

Figure 11A:
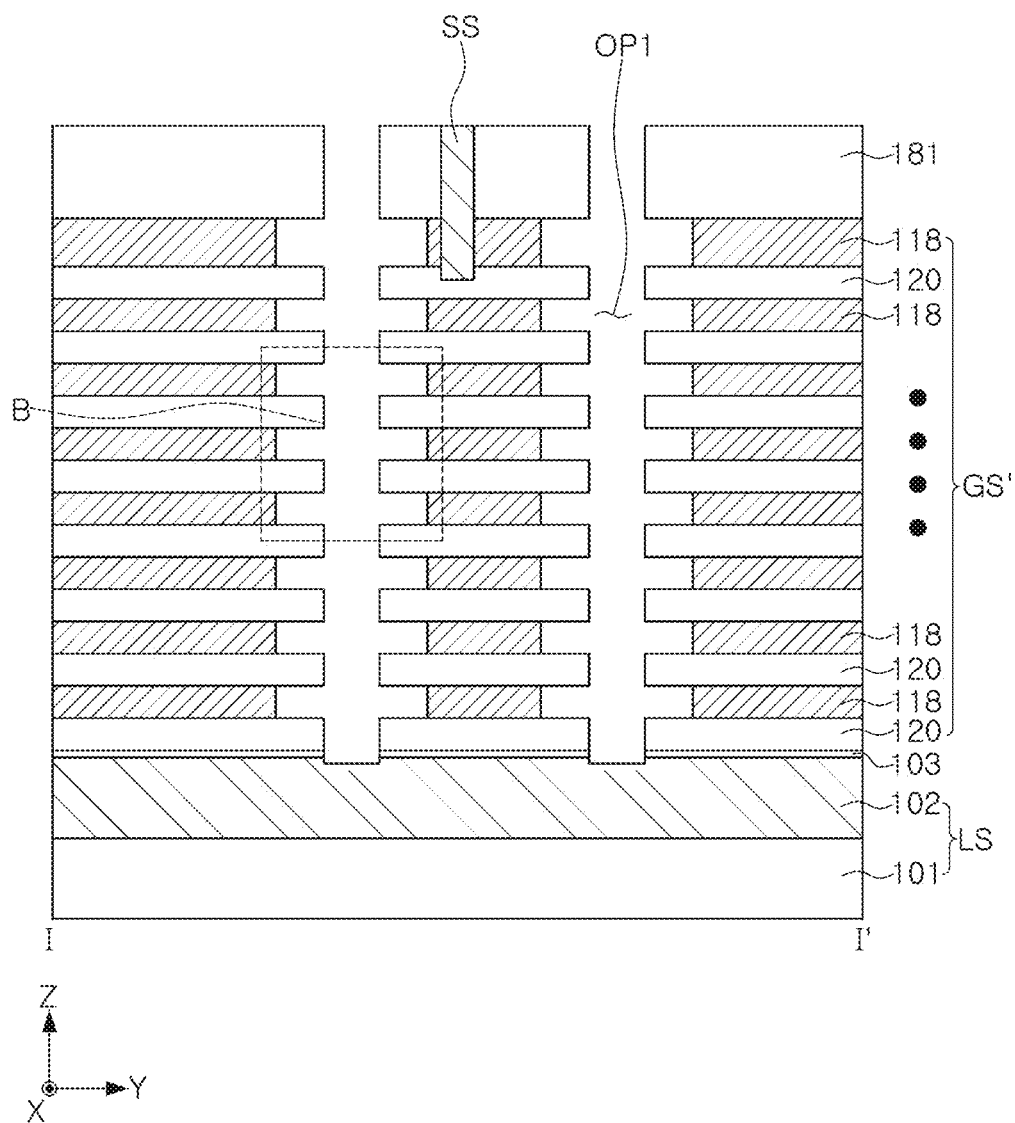
FIGS. 11A to 11D are cross-sectional views and enlarged views illustrating a process sequence to illustrate a method of manufacturing a semiconductor device according to some example embodiments.
Figure 11B:
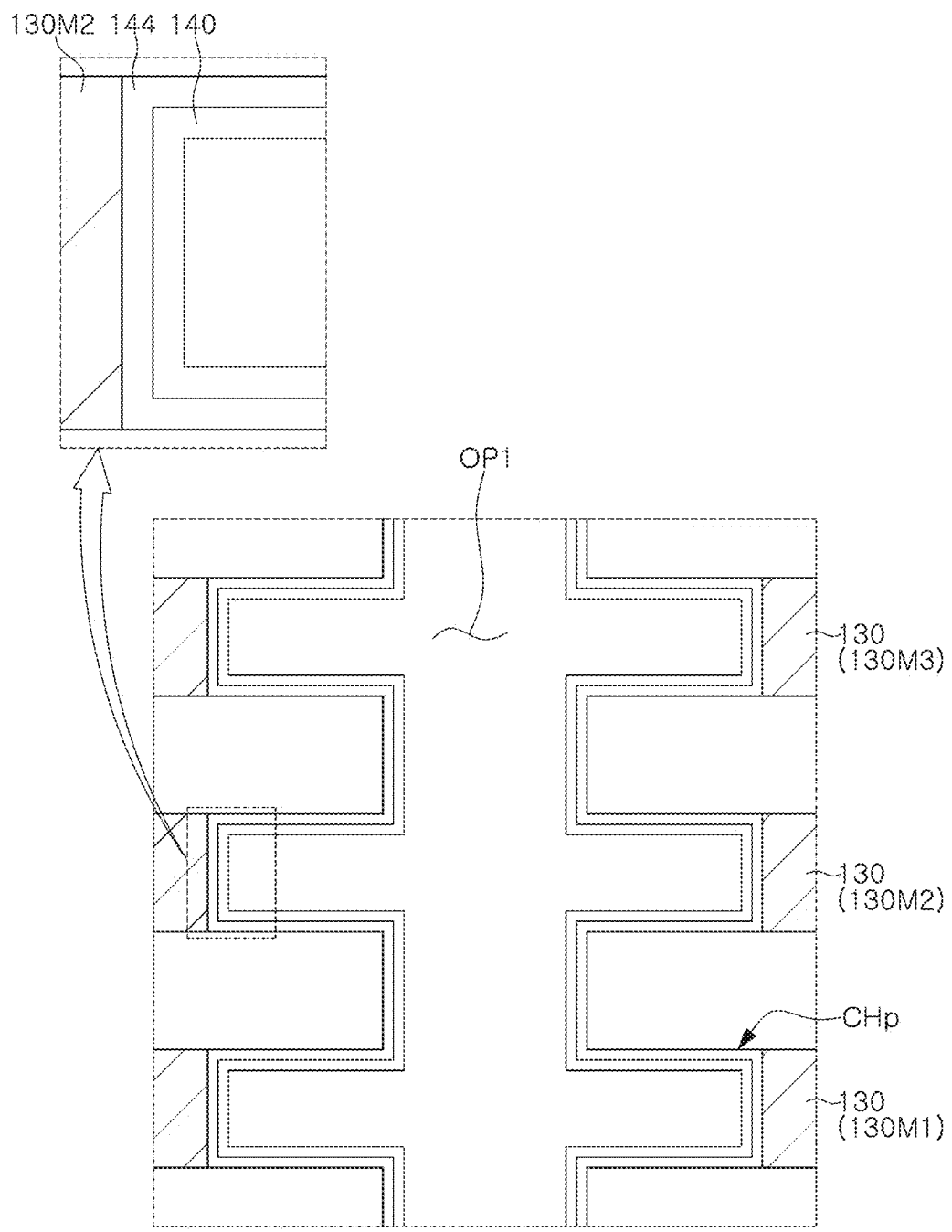
Figure 11C:
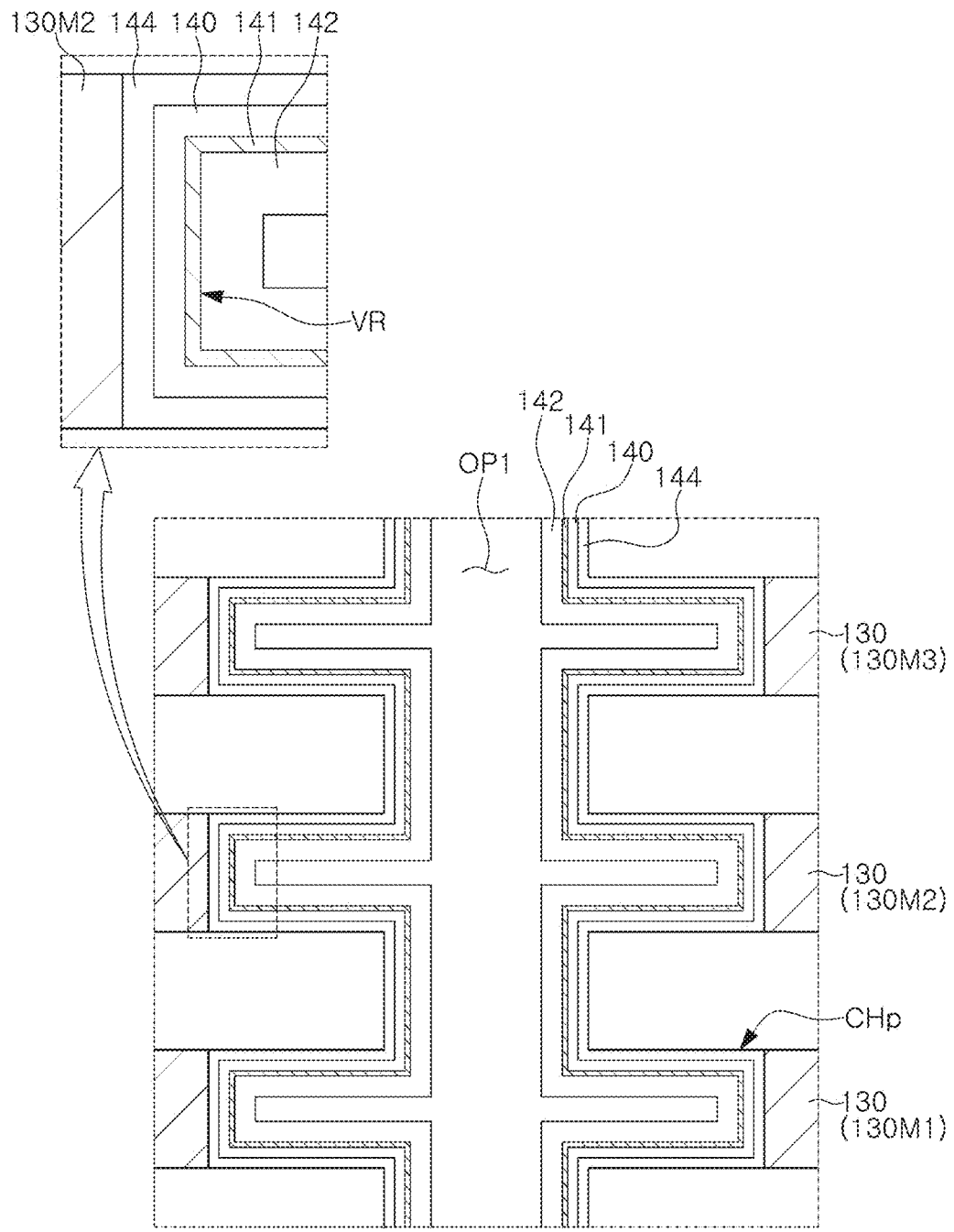
Figure 11D:
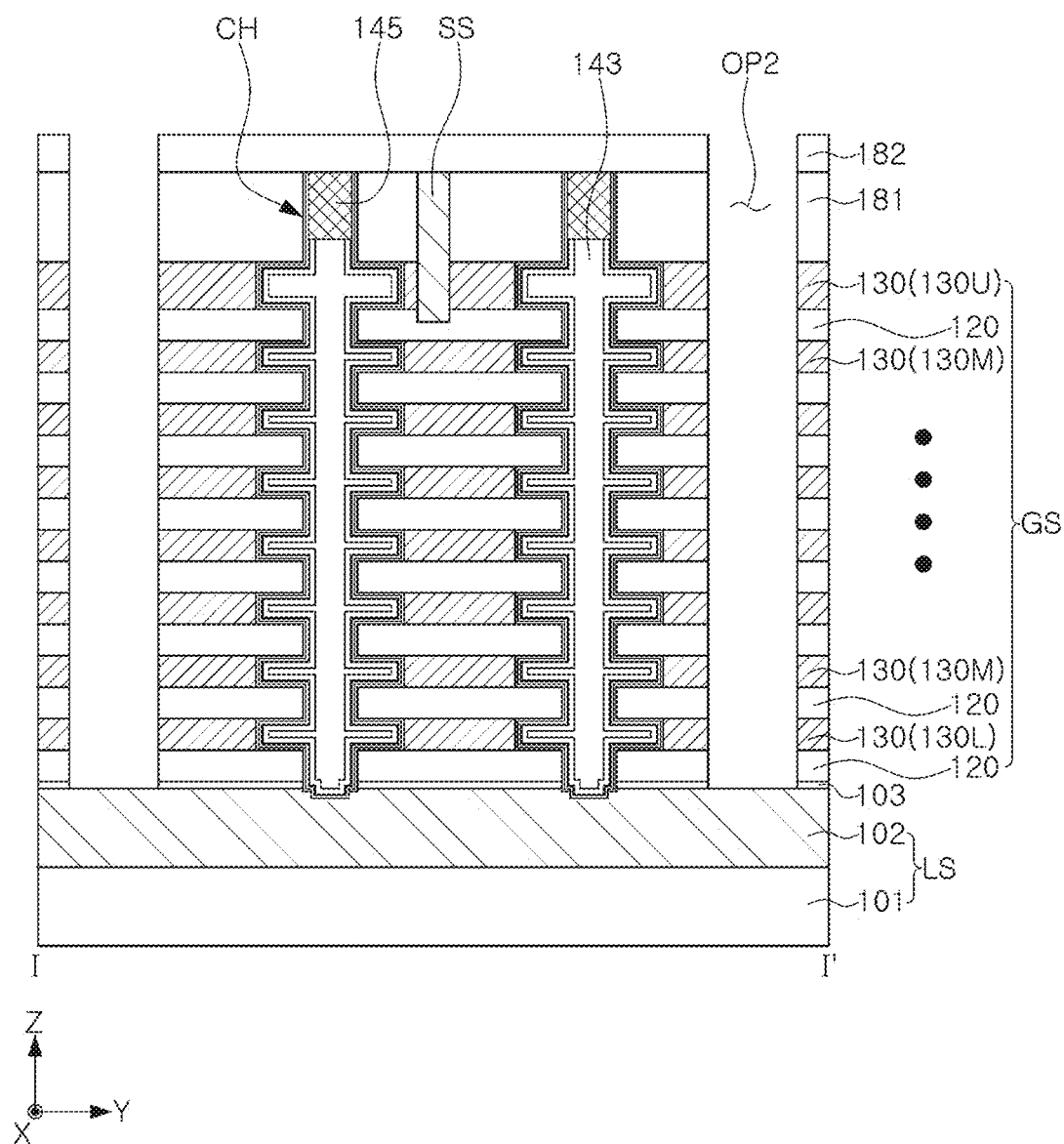

FIGS. 11A to 11D are diagrams illustrating a process sequence to illustrate a method of manufacturing the semiconductor device 100 according to some example embodiments. FIGS. 11A and 11D are cross-sectional views illustrating a region corresponding to FIG. 2, and FIGS. 11B and 11C are partially enlarged views illustrating a region corresponding to region 'B' in FIG. 11A.

Referring to FIG. 11A, substrates 101 and 102 are formed, and interlayer insulating layers 120 and sacrificial insulating layers 118 are alternately stacked to form a preliminary stack structure GS'. A first opening OP1 may be formed to penetrate through the preliminary stack structure GS'.

First, a lower structure LS including the substrates 101 and 102 may be formed by forming a lower region 101, and an upper region 102 having an impurity region on the lower region 101, and the buffer layer 103 may be formed on the lower structure LS. In some example embodiments, forming the lower structure LS may include forming circuit elements on a base substrate, and forming a circuit wiring electrically connected to the circuit elements and a lower insulating layer covering the circuit element and the circuit wiring.

Next, the preliminary stack structure GS' including the interlayer insulating layers 120 and the sacrificial insulating layers 118 that are alternately stacked in the Z-direction on the lower structure LS may be formed. The sacrificial insulating layers 118 may be partially replaced with the gate layers 130 (refer to FIG. 2) through a subsequent process. The sacrificial insulating layers 118 may be formed of a material different from that of the interlayer insulating layers 120, and the interlayer insulating layers 120 may be formed of a material that may be etched with etch selectivity under specific etch conditions. In some example embodiments, the sacrificial insulating layers 118 may include one of a nitride, silicon nitride, or nitride-based material, the interlayer insulating layers 120 may include silicon, and for example, the silicon may be polysilicon such as doped polysilicon. The sacrificial insulating layers 118 and the interlayer insulating layers 120 may have substantially the same thickness, but inventive concepts is not limited thereto, and the thickness may be variously changed. Also, respective thicknesses of the sacrificial insulating layers 118 may not be the same. The thicknesses of the sacrificial insulating layers 118 and the interlayer insulating layers 120 and the number of films constituting the sacrificial insulating layers 118 and the interlayer insulating layers 120 may be variously changed from those illustrated in the drawings.

Next, the first upper insulating layer 181 covering the preliminary stack structure GS' on the substrate 101 may be formed, and a hole passing through the first upper insulating layer 181 and the preliminary stack structure GS' may be formed. The hole may correspond to the vertical opening described with reference to FIG. 2. A portion of the sacrificial insulating layers 118 exposed through the hole may be selectively etched to form the horizontal openings described with reference to FIG. 2. The sacrificial insulating layers 118 may be selectively etched with respect to the interlayer insulating layers 120 under specific etching conditions. Accordingly, the first opening OP1 including the vertical opening and the horizontal opening may be formed. The first opening OP1 may refer to the channel hole H of FIG. 2. The first opening OP1 may penetrate the buffer layer 103 to expose the lower structure LS. The first opening OP1 may extend into the lower structure LS, but in some example embodiments, may contact the upper surface of the lower structure LS without penetrating the lower structure LS. In some example embodiments, the first opening OP1 may include an inclined side surface, but the configuration is not limited thereto.

In this operation, upper separation structures SS passing through a portion of the upper sacrificial insulating layers 120 may be formed. The upper separation structures SS may be formed of silicon oxide.

Referring to FIG. 11B, the dielectric layer 144 and the channel layer 140 may be sequentially formed in the first opening OP1.

The dielectric layer 144 may be formed on a sidewall of the first opening OP1, and the channel layer 140 may be formed in the first opening OP1 to cover the dielectric layer 144 and contact the lower structure LS. The dielectric layer 144 and the channel layer 140 may be formed to extend with a substantially uniform thickness. The thickness of the dielectric layer 144 and the channel layer 140 may be variously changed according to some example embodiments. The channel layer 140 may include a semiconductor material, for example, polysilicon such as doped polysilicon. The channel layer 140 may include a first element and may not include a second element. In some example embodiments, a separate etching process of forming the channel layer 140 is additionally performed such that the heights of the lower surface of the dielectric layer 144 and the lower surface of the channel layer 140 may be different, but inventive concepts is not limited thereto. For example, the lower surfaces of the channel layer 140 and the dielectric layer 144 may be disposed at substantially the same height.

Referring to FIG. 11C, the variable resistance material layer 142 may be formed, and the data storage material layer 141 between the variable resistance material layer 142 and the channel layer 140 may be formed.

In some example embodiments, a cleaning process to remove impurities may be performed and the variable resistance material layer 142 may be formed on the channel layer 140. The cleaning process may be performed to remove impurities on the channel layer 140 using, for example, hydrogen fluoride (HF). After time within about 30 minutes has elapsed after the cleaning process, the variable resistance material layer 142 may be formed.

Next, a transition metal material such as hafnium (Hf) is deposited through an atomic layer deposition (ALD) to form a transition metal layer, and a mixture layer may be formed on the transition metal layer through an ALD process using a mixed gas of oxygen and an additional gas. In some example embodiments, the deposition of the transition metal layer and the mixture layer may be repeatedly performed in a plurality of cycles to alternately stack a plurality of transition metal layers and mixture layers. Next, the variable resistance material layer 142 may be formed through an annealing process or the like. The variable resistance material layer 142 may include a transition metal oxide, and the transition metal oxide may include oxygen and a second element, different from the first element of the channel layer 140. The second element may be a transition metal element of the transition metal layer.

Next, the data storage material layer 141 between the channel layer 140 and the variable resistance material layer 142 may be formed by reacting the channel layer 140 with the variable resistance material layer 142. The data storage material layer 141 may be a layer formed by reacting the semiconductor material of the channel layer 140 with the transition metal oxide of the variable resistance material layer 142 through heat treatment. The data storage material layer 141 may include the first element, the second element, and oxygen. As oxygen ($O_2$) is discharged through the heat treatment, the oxygen vacancy concentration of the data storage material layer 141 may be relatively higher than that of the variable resistance material layer 142. Accordingly, a conductive filament is formed by oxygen vacancies, such that a programming operation may be performed, without a separate forming step of forming the conductive filament during operation of the device. The data storage material layer 141 may have a substantially uniform thickness. The thickness of the data storage material layer 141 may range from about 1 nm to about 3 nm.

Next, the channel structures CH may be formed by sequentially forming the buried insulating layer 143 and the conductive pad 145. However, the operations of forming the buried insulating layer 143 and the conductive pad 145 may be variously changed according to some example embodiments.

Referring to FIG. 11D, a second upper insulating layer 182 covering the first upper insulating layer 181 and the channel structures CH may be formed, a second opening OP2 penetrating through the interlayer insulating layers 120 may be formed, and the sacrificial insulating layers 118 exposed by the second opening OP2 may be removed to form the gate layers 130.

The second opening OP2 having a trench shape, passing through the first upper insulating layer 181, the interlayer insulating layers 120 and the sacrificial insulating layers 118, may be formed. The trench may extend, for example, in the X-direction. The second opening OP2 may pass through the buffer layer 103, but in some example embodiments, the second opening OP2 may only partially recess the buffer layer 103 and may be spaced apart from the lower structure LS.

Next, tunnel portions may be formed by removing the sacrificial insulating layers 118 exposed through the second opening OP2. The sacrificial insulating layers 118 may be selectively etched with respect to the interlayer insulating layers 120 under specific etching conditions. The sacrificial insulating layers 118 may be removed by, for example, a wet etching process.

Next, the gate layers 130 may be formed by filling the tunnels with a conductive material. The conductive material may include a metal, polycrystalline silicon, or a metal silicide material. Accordingly, a stack structure GS in which the gate layers 130 and the interlayer insulating layers 120 are alternately stacked may be formed. In some example embodiments, a gate dielectric layer may be formed by depositing a dielectric material having a uniform thickness while covering the interlayer insulating layers 120 and the channel structures CH, and gate layers may be formed by filling the conductive material between the gate dielectric layers.

Next, the conductive material deposited in the second opening OP2 may be removed through an additional process.

Next, referring back to FIG. 2, the separation structures MS may be formed by filling the second opening OP2 with an insulating material, the third upper insulating layer 183 covering the separation structures MS and the second upper insulating layer 182 may be formed, and upper contact structures 191 that pass through the second and third upper insulating layers 182 and 183 to contact the conductive pad 145, and the upper wiring pattern 192 that is disposed on the upper contact structures 191, may be formed, thereby forming the semiconductor device 100 of FIG. 2.

As set forth above, according to various example embodiments, a semiconductor device and a data storage system having a channel structure including a data storage material layer disposed between a channel layer and a variable resistance material layer to have improved electrical characteristics may be provided.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While some example embodiments have been illustrated and described above, it will be apparent to those skilled in the art that modifications and variations could be made without departing from the scope of inventive concepts as defined by the appended claims. Furthermore, example embodiments are not necessarily mutually exclusive. For example, some example embodiments may include one or more features described with reference to one or more

What is claimed is:

1. A semiconductor device comprising:
a lower structure;
a stack structure including gate layers and interlayer insulating layers alternately stacked on the lower structure in a first direction; and
a channel structure in a channel hole that passes through the stack structure,
wherein the channel structure includes a variable resistance material layer in the channel hole, a data storage material layer between the variable resistance material layer and a sidewall of the channel hole, and a channel layer between the data storage material layer and the sidewall of the channel hole,
the channel layer includes a first element,
the variable resistance material layer includes a second element, different from the first element, and oxygen, and the variable resistance material layer has oxygen vacancies, and
the data storage material layer includes the first element, the second element, and oxygen, and the data storage material layer has oxygen vacancies.

2. The semiconductor device of claim 1, wherein the first element includes silicon (Si), and
the second element includes at least one of hafnium (Hf), aluminum (Al), titanium (Ti), or lanthanum (La).

3. The semiconductor device of claim 1, wherein a first concentration of the oxygen vacancies in the data storage material layer is greater than a second concentration of the oxygen vacancies in the variable resistance material layer.

4. The semiconductor device of claim 1, wherein the data storage material layer includes a material in which the channel layer and the variable resistance material layer are combined in a ratio of greater than or equal to 1 to 1.6 and less than or equal to 1 to 5.6.

5. The semiconductor device of claim 1, wherein the channel layer and the data storage material layer have uniform thicknesses.

6. The semiconductor device of claim 1, wherein a thickness of the data storage material layer is less than a thickness of the variable resistance material layer.

7. The semiconductor device of claim 6, wherein a thickness of the data storage material layer is in a range of 1 nm to 3 nm, and
a thickness of the variable resistance material layer is in a range of 7 nm to 20 nm.

8. The semiconductor device of claim 1, wherein
the channel structure further includes a buried insulating layer extending in the first direction, a conductive pad on the buried insulating layer and in contact with the channel layer, and a dielectric layer between the channel layer and the stack structure, and
the variable resistance material layer covers a side surface of and a bottom surface of the buried insulating layer.

9. The semiconductor device of claim 1, wherein
the channel structure includes first portions on the same height level as the gate layers and second portions on the same height level as the interlayer insulating layers, and
a first distance from a central axis of the channel structure in the first direction to the data storage material layer in each of the first portions is greater than a second distance from the central axis to the data storage material layer in each of the second portions.

10. The semiconductor device of claim 9, wherein the data storage material layer includes a bent portion in the first portions.

11. The semiconductor device of claim 9, wherein
the variable resistance material layer includes protrusions protruding from the first portions toward the gate layers, and
the data storage material layer covers the protrusions.

12. The semiconductor device of claim 1, wherein the gate layers include a first gate portion in a region adjacent to the channel structure, and a remaining second gate portion,
wherein the first gate portion includes doped polysilicon, and
the second gate portion includes a metallic material.

13. The semiconductor device of claim 1, wherein
the lower structure includes a lower substrate, circuit elements on the lower substrate, and an upper substrate on the circuit elements, and
the channel structure is in contact with the upper substrate and is electrically connected to at least a portion of the circuit elements.

14. A semiconductor device comprising:
a lower structure including a substrate;
a stack structure including gate layers and interlayer insulating layers alternately stacked on the lower structure in a vertical direction, perpendicular to the substrate; and
a channel structure in a channel hole passing through the stack structure,
wherein the channel structure includes a variable resistance material layer in the channel hole, a data storage material layer between the variable resistance material layer and a sidewall of the channel hole, and a channel layer between the data storage material layer and the sidewall of the channel hole,
the channel structure includes first portions on the same height level as the gate layers and second portions on the same height level as the interlayer insulating layers,
in a horizontal direction that is perpendicular to the vertical direction, a width of each of the first portions is wider than a width of each of the second portions,
the variable resistance material layer includes a transition metal oxide having oxygen vacancies,
the data storage material layer includes a transition metal-silicon oxide having oxygen vacancies,
the channel layer includes a semiconductor material, and
a first concentration of oxygen vacancies in the data storage material layer is greater than a second concentration of oxygen vacancies in the variable resistance material layer.

15. The semiconductor device of claim 14, wherein
the channel layer includes a first element,
the variable resistance material layer includes a second element, different from the first element, and oxygen, and
the data storage material layer includes the first element, the second element, and oxygen.

16. The semiconductor device of claim 14, wherein
the transition metal oxide includes at least one of hafnium oxide (HfOx), aluminum oxide (AlOx), hafnium-aluminum oxide (HfAlOx), titanium oxide (TiOx), or lanthanum oxide (LaOx), and
the semiconductor material includes polysilicon.

17. The semiconductor device of claim 14, wherein a first thickness of the data storage material layer is less than a second thickness of the variable resistance material layer.

18. The semiconductor device of claim 14, wherein
the channel hole has a vertical opening extending in the vertical direction, and horizontal openings extending from the vertical opening in the horizontal direction, and
each of the channel layer and the data storage material layer continuously extends along sidewalls of the vertical opening and the horizontal openings.

19. A data storage system comprising:
a semiconductor storage device including a lower substrate, circuit elements on the lower substrate, a lower structure on the circuit elements and including an upper substrate, a stack structure including gate layers and interlayer insulating layers alternately stacked on the lower structure in a first direction, the semiconductor storage device further including a channel structure in a channel hole passing through the stack structure, and an input/output pad electrically connected to the circuit elements; and
a controller electrically connected to the semiconductor storage device through the input/output pad and configured to control the semiconductor storage device,
wherein the channel structure includes a variable resistance material layer in the channel hole, a data storage material layer between the variable resistance material layer and a sidewall of the channel hole, and a channel layer between the data storage material layer and the sidewall of the channel hole,
the channel layer includes a first element,
the variable resistance material layer includes a second element, different from the first element, and oxygen, and the variable resistance material layer has oxygen vacancies, and
the data storage material layer includes the first element, the second element and oxygen, and the data storage material layer has oxygen vacancies.

20. The data storage system of claim 19, wherein
the first element includes silicon (Si),
the second element includes at least one of hafnium (Hf), aluminum (Al), titanium (Ti), or lanthanum (La), and
a first concentration of the oxygen vacancies in the data storage material layer is greater than a second concentration of the oxygen vacancies in the variable resistance material layer.

* * * * *